(12) United States Patent
Yamada et al.

(10) Patent No.: US 9,210,304 B2
(45) Date of Patent: Dec. 8, 2015

(54) LOW LIGHT ADAPTIVE IMAGING DEVICE

(75) Inventors: Takahiro Yamada, Hirakata (JP); Sumio Terakawa, Ibaraki (JP)

(73) Assignee: Empire Technology Development LLC, Wilmington, DE (US)

(*) Notice: Subject to any disclaimer, the term of this patent is extended or adjusted under 35 U.S.C. 154(b) by 34 days.

(21) Appl. No.: 14/002,981

(22) PCT Filed: Mar. 16, 2012

(86) PCT No.: PCT/US2012/029431
§ 371 (c)(1),
(2), (4) Date: Sep. 3, 2013

(87) PCT Pub. No.: WO2013/137907
PCT Pub. Date: Sep. 19, 2013

(65) Prior Publication Data
US 2014/0055648 A1 Feb. 27, 2014

(51) Int. Cl.
*H01L 29/80* (2006.01)
*H04N 5/225* (2006.01)
*H01L 27/146* (2006.01)
*H01L 27/148* (2006.01)
(Continued)

(52) U.S. Cl.
CPC .......... *H04N 5/225* (2013.01); *H01L 27/14679* (2013.01); *H01L 27/14862* (2013.01); *H04N 5/35509* (2013.01); *H04N 5/3745* (2013.01)

(58) Field of Classification Search
CPC .................. H01L 27/14665; H01L 27/14579; H01L 24/14862; H01L 29/1066
USPC ............. 257/256–258; 438/57, 60, 66, 73, 75
See application file for complete search history.

(56) References Cited

U.S. PATENT DOCUMENTS

| | | | |
|---|---|---|---|
| 4,499,590 A | 2/1985 | Bluzer | |
| 4,684,968 A * | 8/1987 | Ohta et al. | 257/258 |

(Continued)

FOREIGN PATENT DOCUMENTS

| | | |
|---|---|---|
| JP | 63-304551 | 12/1988 |
| WO | WO 2005/008787 | 7/2004 |
| WO | WO 2007/035858 | 3/2007 |

OTHER PUBLICATIONS

Matsumoto, Kazuhiko, "Measurement System of Single Electron and Spin Using Carbon Nano-tubes," CREST (Core Research of Evolutional Science and Technology), Research Report 2007; Research Area: Creation of nano-devices and nano-systems based on new physical phenomena and functional principles.
(Continued)

*Primary Examiner* — Matthew E Warren
(74) *Attorney, Agent, or Firm* — Dorsey & Whitney LLP

(57) ABSTRACT

Techniques described herein generally relate to digital imaging systems, methods and devices. In some example embodiments, a low light adaptive photoelectric imaging device may include a photoelectric transducer configured to receive and convert incident light into an electric charge that varies in response to an intensity of the received incident light. Some example imaging devices may also include circuitry coupled to the photoelectric transducer and configured to electrically float a potential at one or more terminals of the photoelectric transducer effective to cause the photoelectric transducer to amplify the electric charge according to a gain function that non-linearly varies relative to the intensity of the received incident light.

20 Claims, 16 Drawing Sheets

(51) Int. Cl.
*H04N 5/355* (2011.01)
*H04N 5/3745* (2011.01)

(56) References Cited

U.S. PATENT DOCUMENTS

| | | |
|---|---|---|
| 5,055,667 A | 10/1991 | Sayag |
| 5,132,656 A | 7/1992 | Munroe |
| 6,812,960 B1 | 11/2004 | Komobuchi et al. |
| 8,130,294 B2 | 3/2012 | Fowler et al. |
| 2012/0211806 A1* | 8/2012 | Werner .......... 257/263 |

OTHER PUBLICATIONS

Nascetti, et al., "Amorphous Silicon Phototransistor as Nonlinear Optical Device for High Dynamic Range Imagers", IEEE Transactions on Electron Devices, vol. 49, No. 3, Mar. 2002, pp. 395-399.

Research paper on HARP: Ultra-Sensitivity New Super-HARP Camera, IEEE Transactions on Broadcasting, vol. 42, No. 3, pp. 251-258 (1996).

International Search Report and Written Opinion from International Application No. PCT/US2012/029431 mailed May 23, 2012.

\* cited by examiner

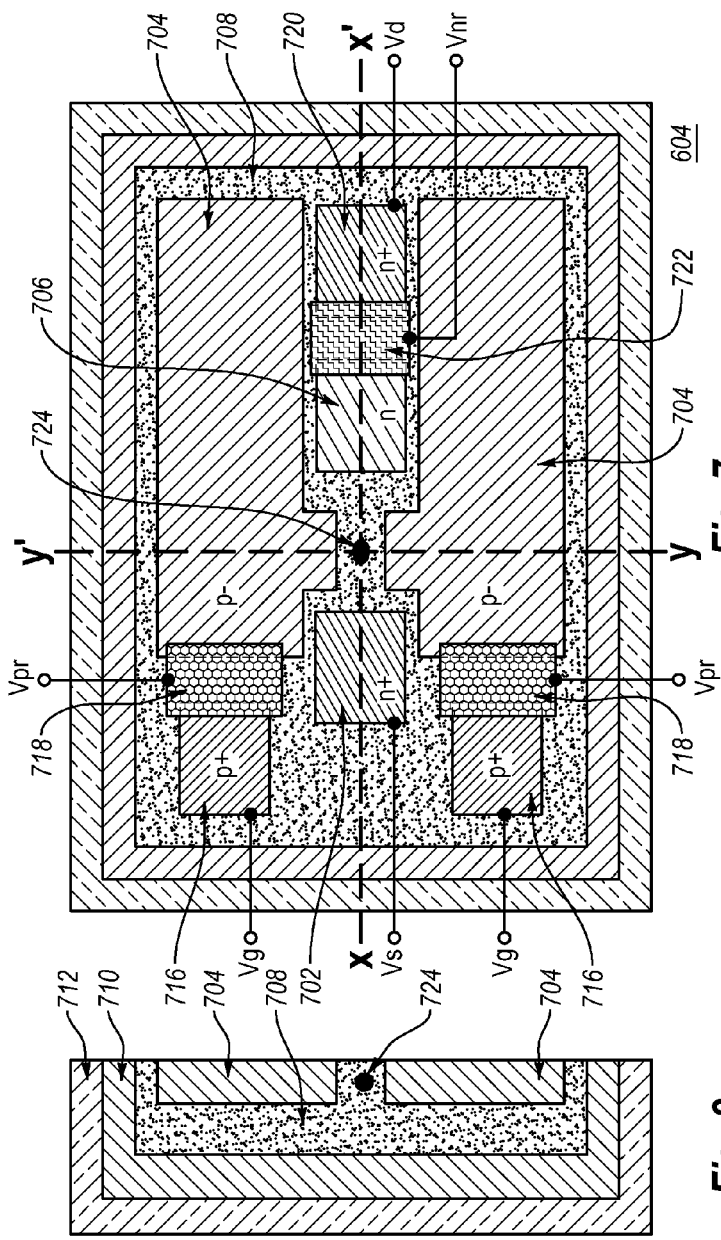
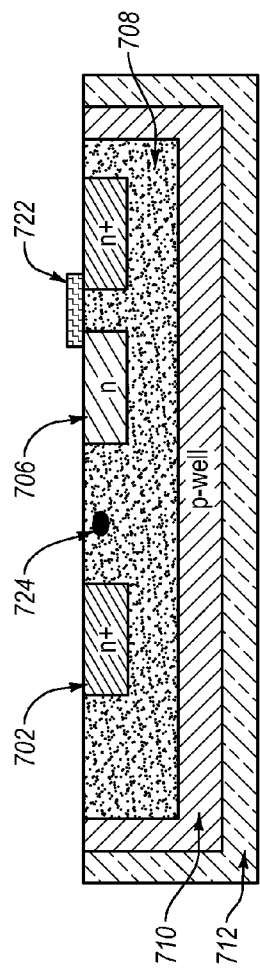
Fig. 7
Fig. 8
Fig. 9

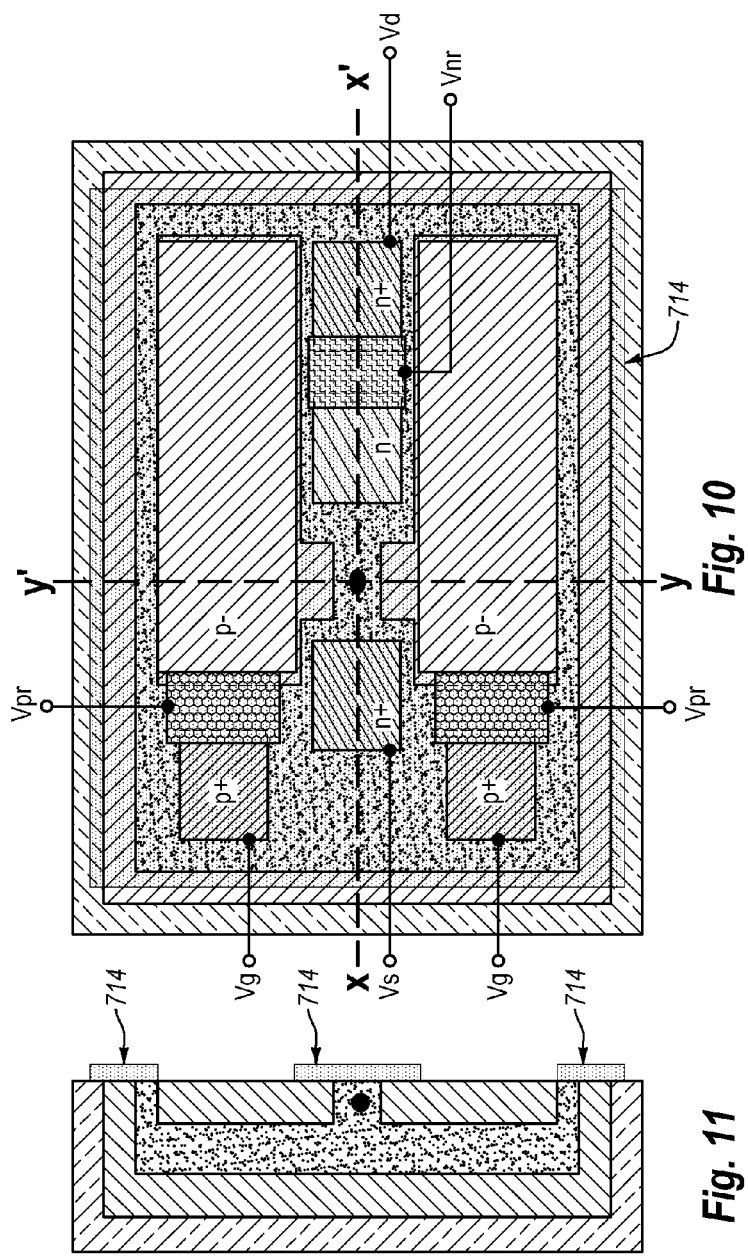
Fig. 10
Fig. 11
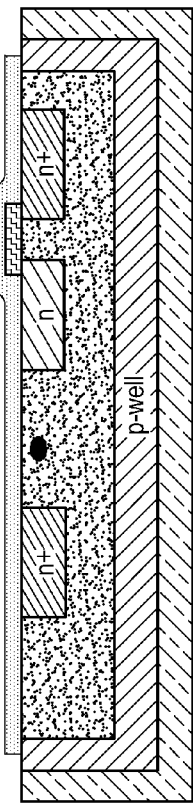
Fig. 12

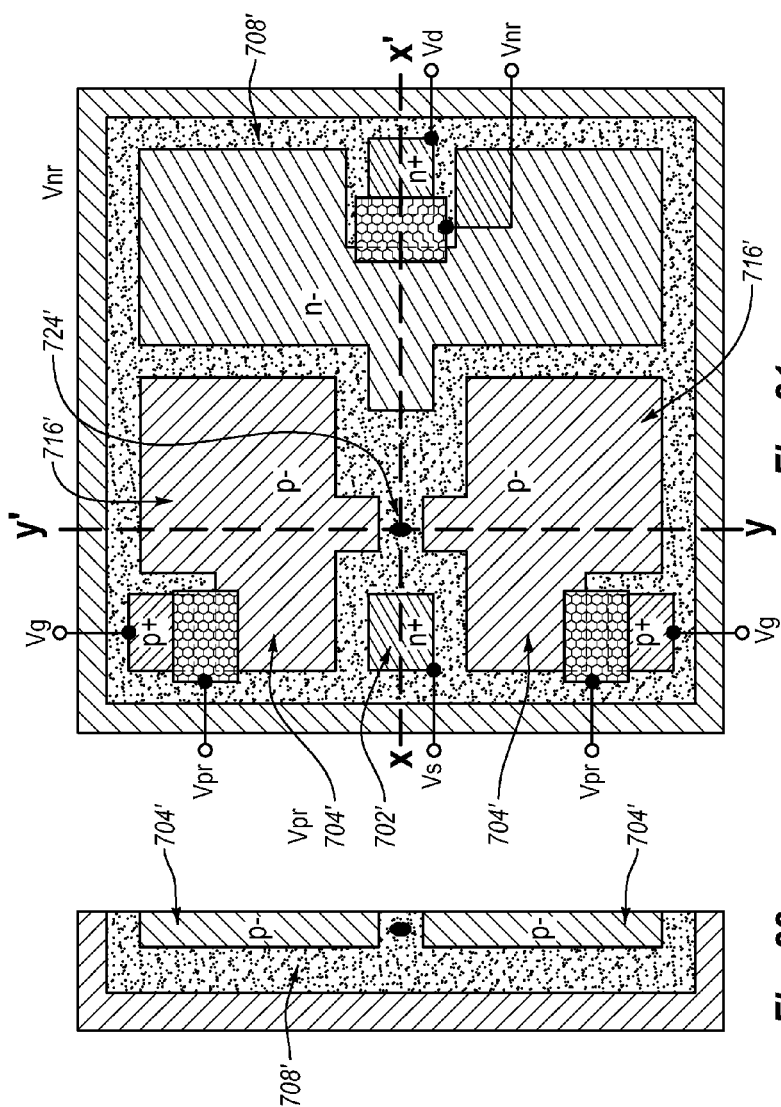
*Fig. 21*
*Fig. 22*
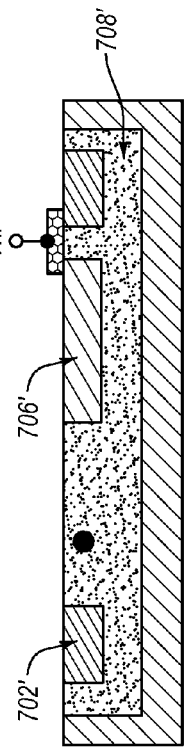
*Fig. 23*

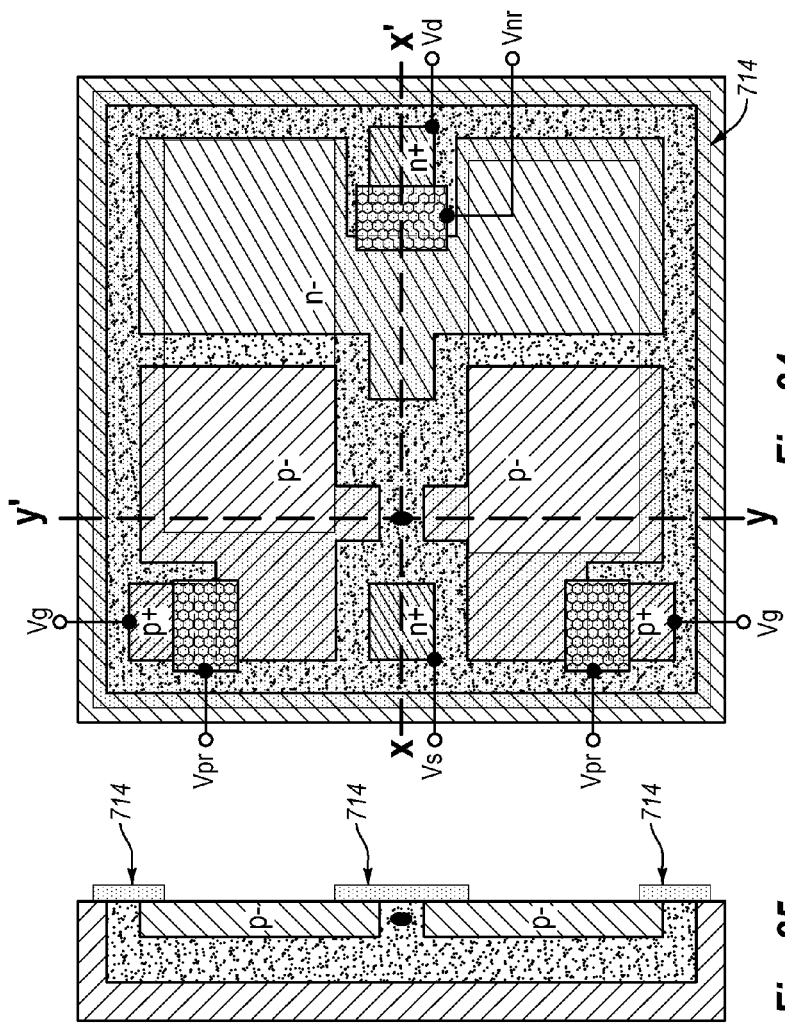
*Fig. 24*
*Fig. 25*
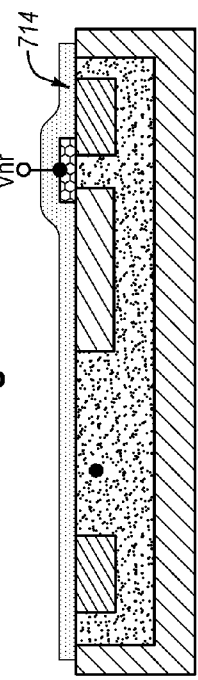
*Fig. 26*

LOW LIGHT ADAPTIVE IMAGING DEVICE

CROSS-REFERENCE TO RELATED APPLICATION

The present application is a national stage filing under 35 U.S.C. §371 of PCT Application No. PCT/US12/29431, entitled "LOW LIGHT ADAPTIVE IMAGING DEVICE", filed on Mar. 16, 2012, hereby incorporated by reference therein in its entirety.

BACKGROUND

Unless otherwise indicated herein, the materials described in this section are not prior art to the claims in this application and are not admitted to be prior art by inclusion in this section.

Conventional digital cameras are typically equipped with imaging devices (i.e., imaging elements or imaging pixel cells). An imaging device may be implemented as, for example, a charge-coupled device (CCD) or a complementary metal-on-silicon (CMOS) imaging device. A photodiode can directly convert photo-carriers generated by light incident on the surface of its semiconductor light-receiving element into a current. Such imaging elements are intended to capture images of objects illuminated by light levels that typically range from candle light (10 Lx) to direct sunlight (100,000 Lx). When taking images under lower illumination levels, such as street lighting (0.1 Lx), moonlight (0.01 Lx), or starlight (0.0001 Lx), some digital cameras may require the use of external lighting or flash units because of poor imaging sensitivity under such low light conditions.

To reduce the size and weight of camera modules for devices such as mobile phones and the like, the imaging devices used in such digital cameras have been increasingly miniaturized. The miniaturization reduces the area available for photoelectric conversion. Consequently, the efficiency of such imaging devices has been reduced. In addition, external lighting or flash units are often necessary to obtain images of acceptable quality even in daytime lighting conditions.

Photodiodes have difficulty adapting to low light levels because, among other reasons, the signal to noise (S/N) ratio of a photodiode is constant with respect to incident light intensity. The graphs in FIG. 1 illustrate the constant S/N ratio property of a photodiode's output. More specifically, the amount of charge in both an output signal S, denoted by a signal line 101, and noise N (e.g., thermal noise generated by signal charge fluctuation), denoted by a noise line 102, increase in linear proportion to incident light levels.

Phototransistors, as opposed to photodiodes, may be configured to amplify the output signal S to reduce the need for external lighting or the like and to advantageously reduce the influence of external noise generated by adjacent circuits, such as the switching noise generated by driving circuits. Like photodiodes however, the graphs of FIG. 2 further illustrate the constant S/N ratio property of an amplifying phototransistor. The amount of charge in both an output signal S (denoted by a signal line 201) and in the noise N (denoted by a noise line 202) are linear functions of incident light, as are the corresponding lines 101 and 102 of the photodiode. In fact, the signal line 201 and the noise line 202 may be obtained from the corresponding lines in FIG. 1 by simply moving the signal line 101 and the noise line 102 in FIG. 1 vertically to a position 204 that corresponds to the gain α.

The human eye can see objects with the help of only dim light, such as starlight or moonlight, without artificial lighting. The weak or dim light induces dark adaptation in the eye, in which the chemical reaction cycle of the photoreceptor molecules (rhodopsin) contained in rod cells amplifies optical signals. In dark adaptation noise does not become so high that objects cannot be recognized. In other words, the S/N ratio of optical signals in dim light situations is increased in the eye, because the optical signals are amplified in the eye while noise is not amplified. An imaging device that amplifies the S/N ratio of optical signals in such a way does not yet exist.

SUMMARY

The present disclosure generally relates to low light adaptive photoelectric imaging devices. In some examples, devices are described that are adapted to suppress fluctuation noise while amplifying optical signals from objects under low illumination, in a manner that is similar to dark adaptation of a human eye. Various examples described herein also generally relate to methods of manufacturing such low light adaptive photoelectric imaging devices.

In a first example embodiment, a low light adaptive photoelectric imaging device is described that includes a photoelectric transducer configured to receive and convert incident light into an electric charge that varies in response to an intensity of the received incident light. The example imaging device may also include circuitry coupled to the photoelectric transducer and configured to electrically float a potential at one or more terminals of the photoelectric transducer effective to cause the photoelectric transducer to amplify the electric charge according to a gain function that non-linearly varies relative to the intensity of the received incident light.

In a second example embodiment, a low light adaptive imaging apparatus configured to produce an image is described that includes a plurality of instances of the foregoing imaging device of the first example embodiment. The imaging devices may be arranged in an array including rows and columns, each imaging device corresponding to an image pixel. The imaging apparatus may further include vertical scan circuitry configured to selectively activate each individual row of the low light adaptive photoelectric imaging devices in the array, and horizontal scan circuitry configured to selectively sample outputs of each individual column of low light adaptive photoelectric imaging devices for the low light adaptive photoelectric imaging devices that are activated by the vertical scan circuitry.

In a third example embodiment, a low light adaptive photoelectric imaging device is described that includes a phototransistor having an intrinsic gate, an extrinsic gate, and a drain. The intrinsic gate may be formed in an intrinsic semiconductor material and the extrinsic gate may be formed in an extrinsic semiconductor material. Furthermore, the phototransistor may be configured to receive incident light at least at the extrinsic gate and to convert the received incident light into an electric charge that varies responsive to an intensity of the received incident light. In addition, the extrinsic gate and the drain may be extrinsically doped such that a depletion capacitance between the intrinsic gate and the drain differs from a depletion capacitance between the intrinsic gate and the extrinsic gate effective to form an electric potential barrier in the phototransistor. Furthermore, the electric potential barrier is effective to cause a gain of the phototransistor to non-linearly vary responsive to the intensity of the received incident light.

In a fourth example embodiment, a low light adaptive photoelectric imaging device is described that includes a semiconductor substrate, an extrinsic well formed on the semiconductor substrate, and an intrinsic region formed in the extrinsic well. The imaging device may further include a source located within the intrinsic region and doped as a first polarity type of semiconductor material, a drain located within the intrinsic region and doped as the first polarity type of semiconductor material, and a light sensitive gate doped as a second polarity type of semiconductor material that differs from the first polarity type of semiconductor material. The light-sensitive gate may be located within the intrinsic region with at least a portion of the light sensitive gate extending between the source and drain. In addition, the drain and light-sensitive gate may be doped to facilitate formation of a depletion capacitance between the intrinsic region and the drain that differs from a depletion capacitance between the intrinsic region and the light-sensitive gate such that an electric potential barrier is formed during operation of the imaging device. Furthermore, the electric potential barrier may be effective to cause a gain of the photoelectric imaging device to non-linearly vary responsive to an incident light intensity.

In a fifth example embodiment, a low light adaptive imaging apparatus configured to produce an image is described that includes a plurality of instances of the photoelectric imaging device of the fourth example embodiment. The imaging devices may be arranged in an array including rows and columns, each imaging device corresponding to an image pixel. The imaging apparatus may further include vertical scan circuitry configured to selectively activate each individual row of the low light adaptive photoelectric imaging devices in the array, and horizontal scan circuitry configured to selectively sample outputs of each individual column of low light adaptive photoelectric imaging devices for the low light adaptive photoelectric imaging devices that are activated by the vertical scan circuitry.

In a sixth example embodiment, a method of manufacturing a low light adaptive photoelectric imaging device is described that includes: forming an extrinsic well in a semiconductor substrate; forming an intrinsic region in the extrinsic well; forming a source by doping a first portion of the intrinsic region as a first polarity type of semiconductor material; forming a drain by doping a second portion of the intrinsic region as the first polarity type of semiconductor material; and forming a light-sensitive gate by doping a third portion of the intrinsic region as a second polarity type of semiconductor material. The light-sensitive gate may be formed such that at least a portion thereof is located between the source and the drain. The drain and light-sensitive gate of the phototransistor may be doped to facilitate formation of a depletion capacitance between the intrinsic region and the drain that differs from a depletion capacitance between the intrinsic region and the light-sensitive gate such that an electric potential barrier is formed during operation of the imaging device. In addition, the electric potential barrier may be effective to cause a gain of the photoelectric imaging device to non-linearly vary responsive to an incident light intensity.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

In the drawings:

FIG. 7 is a plan view of a first example circuit layout of a photoelectric conversion imaging device of the imaging apparatus in FIG. 3 that is arranged in accordance with at least some examples described herein.

FIG. 8 is a first cross-sectional view of the first example circuit layout of FIG. 7 that is arranged in accordance with at least some examples described herein.

FIG. 9 is a second cross-sectional view of the first example circuit layout of FIG. 7 that is arranged in accordance with at least some examples described herein.

FIG. 10 is a plan view of the first example circuit layout of FIG. 7 in which a light-masking layer that passes incident light to certain regions or portions of the photoelectric conversion imaging device is included, arranged in accordance with at least some examples described herein.

FIG. 11 is a first cross-sectional view of the example circuit layout of FIG. 10 that is arranged in accordance with at least some examples described herein.

FIG. 12 is a second cross-sectional view of the example circuit layout of FIG. 10 that is arranged in accordance with at least some examples described herein.

FIG. 21 is a plan view of a second example circuit layout of the photoelectric conversion imaging device of FIG. 3 that is arranged in accordance with at least some examples described herein.

FIG. 22 is a first cross-sectional view of the second example circuit layout of FIG. 21 that is arranged in accordance with at least some examples described herein.

FIG. 23 is a second cross-sectional view of the second example circuit layout of FIG. 21 that is arranged in accordance with at least some examples described herein.

FIG. 24 is a plan view of the second example circuit layout of FIG. 21 in which an example light-masking layer passes incident light to certain regions or portions of the photoelectric conversion imaging device that is arranged in accordance with at least some examples described herein.

FIG. 25 is a first cross-sectional view of the example circuit layout of FIG. 24 that is arranged in accordance with at least some examples described herein.

FIG. 26 is a second cross-sectional view of the example circuit layout of FIG. 24 that is arranged in accordance with at least some examples described herein.

DETAILED DESCRIPTION

Figure 2:
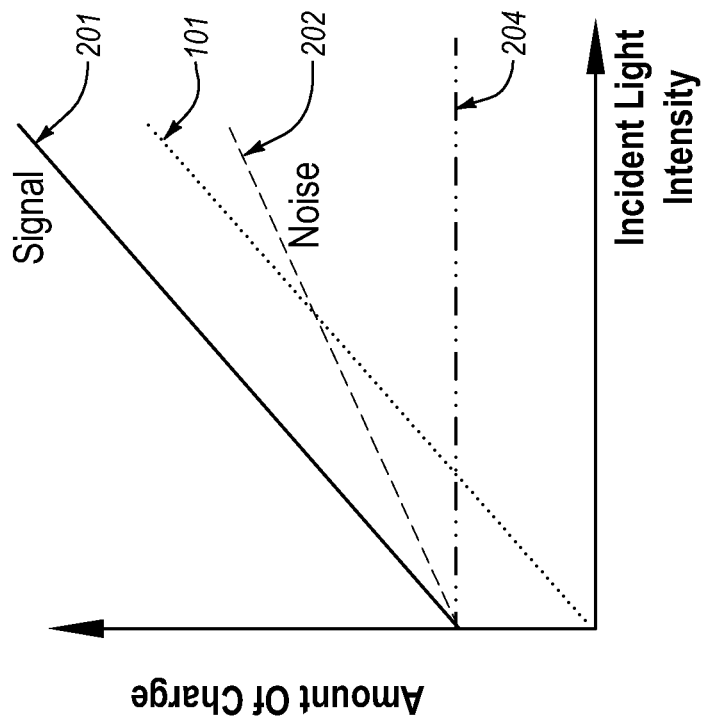
FIG. 2 shows graphs that illustrate a S/N ratio characteristic of a conventional phototransistor.
Figure 1:
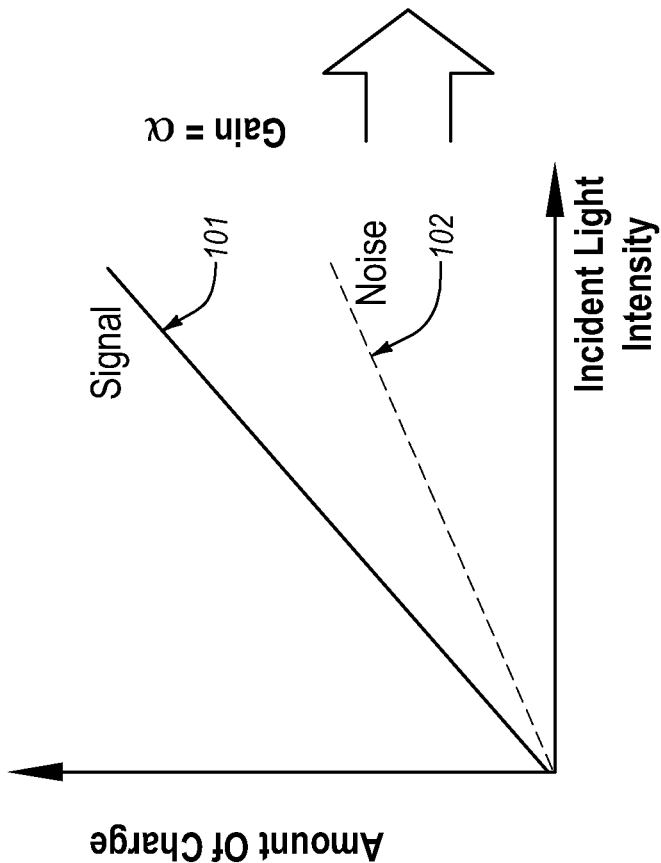
FIG. 1 shows graphs that illustrate a S/N ratio characteristic of a conventional photodiode output.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to systems, methods, and apparatus related to digital imaging. More specifically, embodiments of the present disclosure relate to digital imaging devices that employ various described techniques to adapt their gain for low light conditions.

Briefly stated, techniques described herein generally relate to digital imaging systems, methods and devices. In some example embodiments, a low light adaptive photoelectric imaging device may include a photoelectric transducer configured to receive and convert incident light into an electric charge that varies in response to an intensity of the received incident light. Some example imaging devices may also include circuitry coupled to the photoelectric transducer and configured to electrically float a potential at one or more terminals of the photoelectric transducer effective to cause the photoelectric transducer to amplify the electric charge according to a gain function that non-linearly varies relative to the intensity of the received incident light.

Some embodiments disclosed herein may relate to photoelectric imaging devices and methods of manufacturing same. Embodiments include a new phototransistor in a photoelectric imaging device. The photoelectric imaging device arranged in accordance with some embodiments may adapt to low levels of light by applying a gain function that non-linearly varies relative to an incident light intensity. As further discussed in detail below, the non-linearity of the gain function can be achieved by setting an amplifying phototransistor of the photoelectric imaging device in a non-equilibrated state.

Some example uses for a low light adaptive photoelectric imaging device is in an imaging apparatus or camera configured for acquiring images of various types and formats including still images and videos. Monitoring cameras and phone cameras, for example, have become increasingly miniaturized. However, miniaturization has lead to decreased light sensitivity, which can be very problematic in low light conditions. Embodiments of a low light adaptive photoelectric imaging device described below can facilitate increased miniaturization without sacrificing sensitivity and are therefore well-suited for use in ultra-compact imaging apparatuses, including ultra-compact video cameras and ultra-compact still cameras. Moreover, the increased sensitivity of such low light adaptive photoelectric imaging devices can facilitate flexibility in setting vertical and horizontal blanking intervals when used with a television scanning system, which implements line-sequential imaging. Notably, such low light adaptive photoelectric imaging devices are not limited to use in an imaging apparatus, but may be used in any application in which a small imaging device is desirable but that does not sacrifice sensitivity.

Embodiments of the disclosure can prevent an output signal from exceeding the dynamic range of an imaging apparatus when amplifying under high illumination. In addition, the amplification gain can be non-linear at low illumination. The non-linear amplification, for example at low illumination levels, controls charge fluctuations generated by photoelectric conversion and suppresses noise.

Figure 3A:
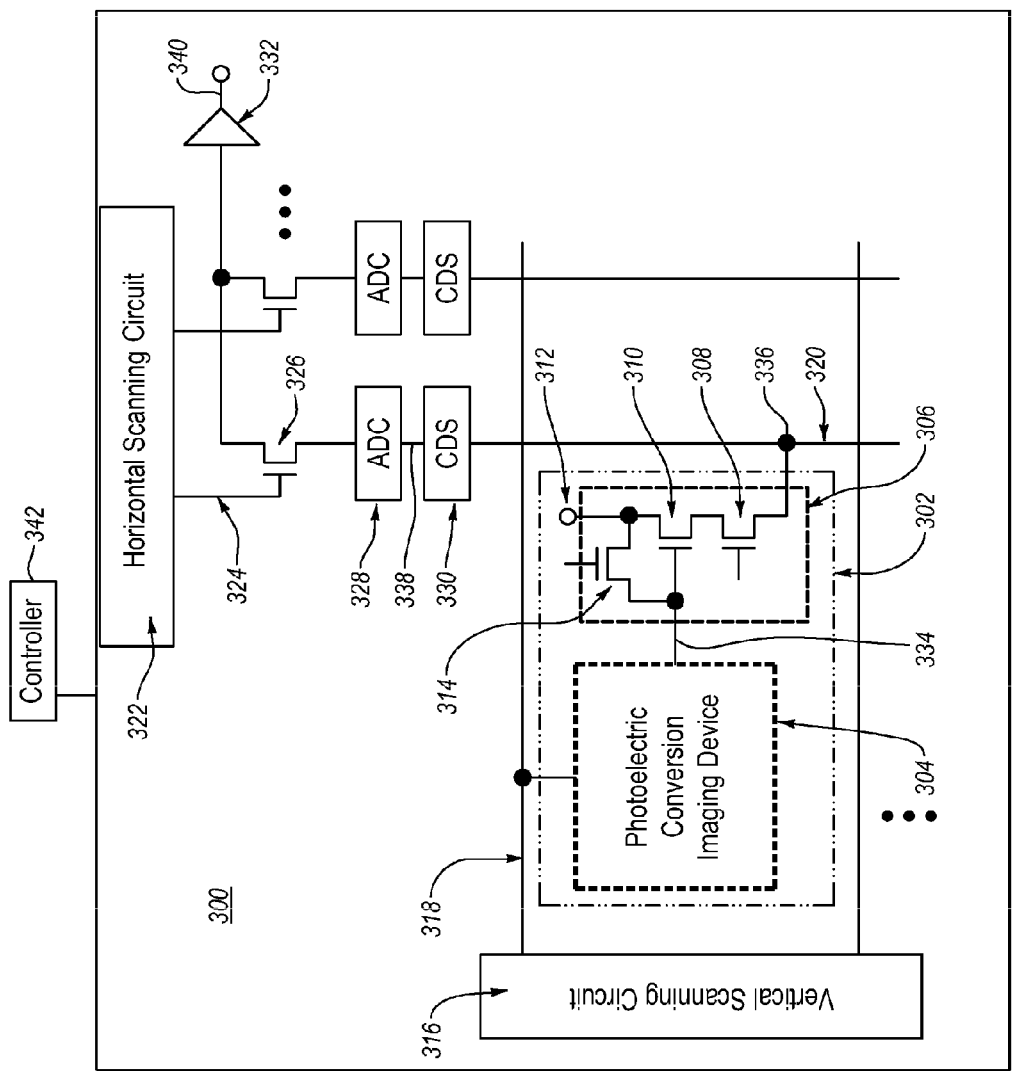
FIG. 3A shows a circuit diagram of an example imaging apparatus that is arranged in accordance with at least some examples described herein.

FIG. 3A shows a circuit diagram of an example imaging apparatus 300 that is arranged in accordance with at least some examples described herein. Imaging apparatus 300 may include multiple instances of the low light adaptive photoelectric imaging device and associated circuitry. In some embodiments, the circuitry of imaging apparatus 300 can be implemented with solid-state components. In some embodiments, the example imaging apparatus 300 may be configured to perform one or more of a non-linearly varying gain function and/or a non-equilibrated gain function. In one example, non-linearity indicates that the change in the gain is not linear with a change in the incident light. Non-equilibrated relates, in one example, to a change of amplification factor due to incident light. In one example, the non-linear state and the non-equilibrated state can be obtained in a region by allowing an internal potential of the imaging apparatus 300 to float.

The imaging apparatus 300, as described in more detail below, includes a photoelectric conversion imaging device 304 that includes transistor elements including one or more gates, an intrinsic gate, one or more drains, and one or more sources. The accumulation of electrical charge obtained by photoelectrically converting incident light occurs when both the drain potential and the gate potential are floating, for example disconnected from a voltage. In contrast, conventional phototransistors are designed to keep the potential of the gate and of the drain constant. Embodiments relate to a new phototransistor included in the photoelectric conversion imaging device 304.

The various described functions may enable the operation of the imaging apparatus 300 in low light conditions without the use of an external light source.

Some example imaging apparatuses like the imaging apparatus 300 may be controlled by a controller 342, processor or the like. The imaging apparatus 300 may include a two-dimensional array of imaging devices 302. Each imaging device 302 may correspond to a pixel of an image produced by the array of imaging devices 302. Moreover, each imaging device 302 may include a photoelectric conversion imaging device 304 and a signal detection section 306.

The photoelectric conversion imaging device 304 can be configured to amplify in a non-linear and/or non-equilibrated manner. The photoelectric conversion imaging device 304 can amplify carriers corresponding to photocarriers generated by incident light. The photoelectric conversion imaging device 304 can store amplified charges. A charge storage section electrically floats while accumulating charge and reduces the charge gain according to a decreased voltage of the charge storage section caused by increased carriers stored therein. In one example, the charge storage section electrically floats by cutting off an applied voltage and the charge accumulates while the charge storage section electrically floats.

The signal detection section 306 may include an amplifier including a pair of transistors 308 and 310 arranged in a cascade series configuration with a source terminal 312, which is connected to power, and a transistor switch 314 that is coupled between a gate and source of the transistor 310. The switch 314 can enable the signal detection section 306 to be read by the photoelectric conversion imaging device 304. The switch 314 may also be used to supply power to the photoelectric conversion imaging device 304.

An output of the photoelectric conversion imaging device 304 can be coupled to a gate of the transistor 310 in the signal detection section 306. The signal detection section 306 is adaptively (e.g., based on the operation of switch 314) configured to amplify the input to the transistor 310 and the amplified signal can be read as an output.

More specifically, the imaging apparatus 300 may include vertical scan circuitry 316 and horizontal scan circuitry 322, which may be controlled or operated by a controller 342 that is operatively connected with the imaging apparatus 300 or integral therewith. The vertical scan circuitry 316 can be configured to selectively activate each individual row of imaging devices 302 in the two-dimensional array. The horizontal scan circuitry 322 can be configured to selectively sample outputs of each individual column of imaging devices 302 for the low light adaptive photoelectric imaging devices that are activated by the vertical scan circuitry.

The imaging apparatus 300 may include vertical scan circuitry 316, vertical scanning control lines 318, and vertical signal lines 320. The imaging apparatus may include the horizontal scan circuitry 322, horizontal scanning control lines 324, horizontal scanning switches 326, dedicated analog to digital converter ("ADC") circuits 328, dedicated correlated double sampling ("CDS") circuits 330, and an amplifier circuit 332. A stream of pixel signals output by amplifier circuit 332 may represent an image that can be recorded in a memory.

To produce a stream of pixel signals, vertical scanning control circuitry 316 may be configured to sequentially activate rows of imaging devices 302, while horizontal scanning control circuitry 322 may be configured to sequentially activate horizontal scanning switches 326 for each activated row. For example, vertical scanning control circuitry 316 is configured to activate a row of imaging devices 302 by activating a corresponding one of the vertical scanning control lines 318, each of which may be coupled to a row of imaging devices 302. When a particular row of imaging devices 302 is activated, each photoelectric conversion imaging device 304 in the activated row can be configured to be activated to produce a signal (e.g., a voltage or current) representing a detected light intensity level corresponding to a pixel. A pixel signal 334 may be output to signal detection section 306 and amplified by transistors 308 and 310 of signal detection section 306. The amplified pixel signal 336 produced by each signal detection section 306 may be output to a corresponding one of vertical signal lines 320, where the amplified pixel signal may be fed to a corresponding one of CDS devices 330. Each CDS device 330 can be configured to remove fixed-pattern noise generated by signal detection section 306. The output 338 of each CDS device 330 may then be fed to a corresponding one of ADCs 328 for conversion to a digital pixel signal 340.

Horizontal scanning control circuitry 322 may be adapted, for example by the controller 342 to sequentially activate horizontal scanning switches 326, e.g., in a left-most toward right-most order, to sample outputs of ADCs 328 and produce a stream of digital pixel signals representing a row of an image. After the stream of digital pixel signals is fed to amplifier circuit 332 for amplification and/or subsequent storage, the same steps can be repeated for additional rows of imaging devices 302, e.g., in a top-most row to bottom-most row sequential order, to produce and store additional streams of digital pixel signals representing additional rows of pixels in an image. The foregoing description of the imaging process and scanning circuitry is provided as just one example implementation for obtaining an image. Therefore, photoelectric conversion imaging device 304 is not limited to use with the particular circuitry described above and may instead be used in other ways and/or with other circuitry.

Figure 3B:
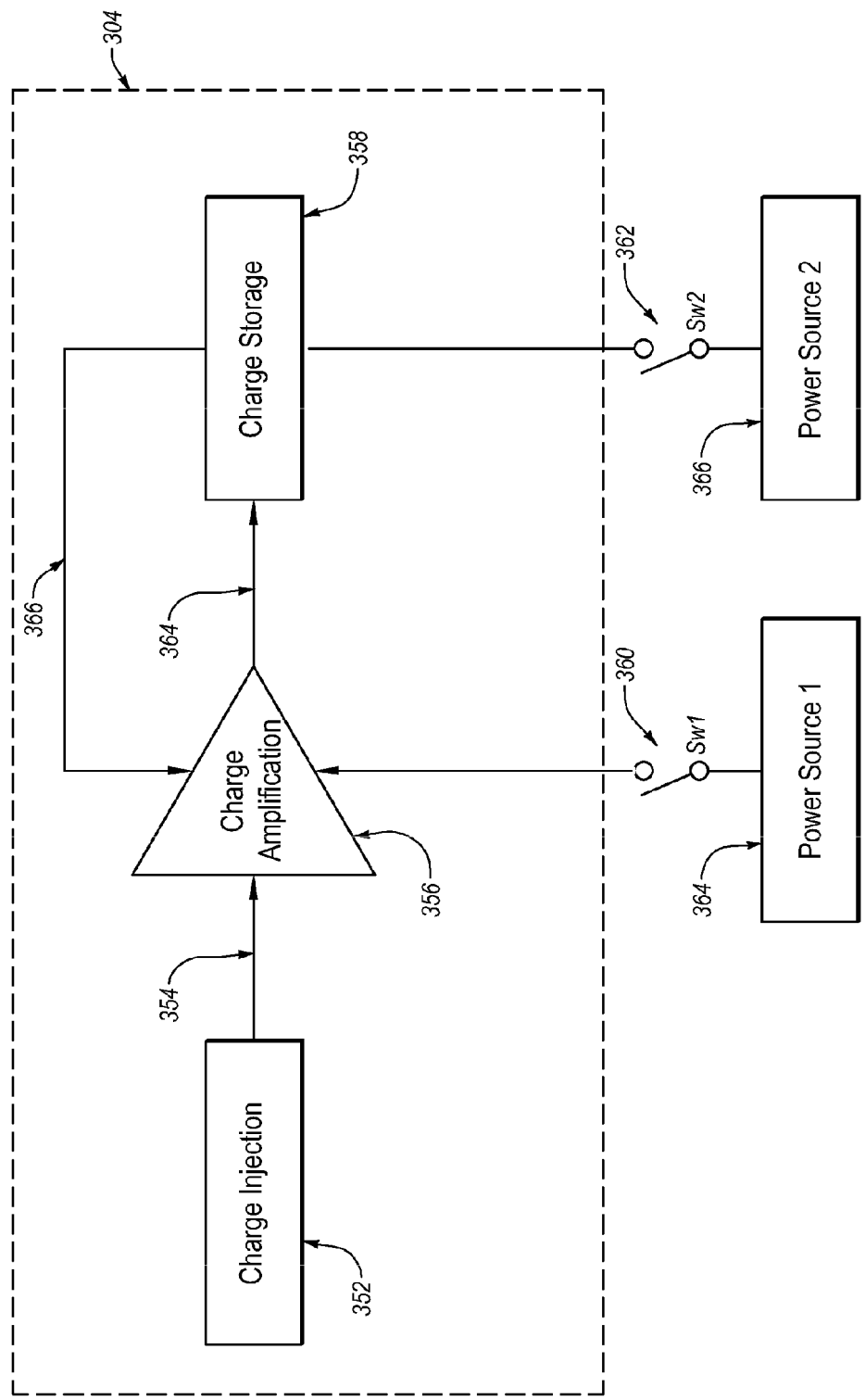
FIG. 3B depicts a conceptual block diagram of the photoelectric conversion imaging device and additional circuitry that are arranged in accordance with at least some examples described herein.

FIG. 3B depicts a conceptual block diagram of the photoelectric conversion imaging device 304 and additional circuitry that are arranged in accordance with at least some examples described herein. The photoelectric conversion imaging element 304 includes a charge-injection section 352, a charge amplification section 356, and a charge storage section 358. Power sources 364 and 366 electrically initialize the charge amplification section 356 and the charge storage section 358 by closing the switches 360 and 362.

The switches 360 and 362 may be opened before starting photoelectric conversion, which electrically floats the charge amplification section 356 and the charge storage section 358. In one example, a charge is injected from the charge injection section 352 into the charge amplification section 356 as indicated by arrow 354. The charge amplification section 356, with a gain $\beta(m)$, moves a charge of $\beta(m) \times m = \beta(m)m$ to the charge storage section 358 as indicated by the arrow 364, where the charge is stored.

Advantageously, multiplied charge is stored in the charge storage section 358. As the charge accumulates, the voltage of the charge storage section 358 is reduced. The reduction of voltage is feedback to the charge amplification section 356, as shown by the arrow 366. This feedback results in a decrease in the gain β(m) of the charge amplification section 356.

As described in more detail herein, the new phototransistor can be arranged in different configurations. The amplification process discussed herein can reduce noise. After applying a specified voltage to the photoelectric conversion imaging device 304, the charge storage section 356 and the charge storage section 358 are electrically floated by switching the voltage off. The photoelectric conversion imaging element may then be irradiated with weak light and a signal charge β(m)×m, which is generated by amplifying the weak light-generated photo carriers m by the gain β(m), is injected through a charge injection section 352 to be accumulated in the charge storage section 358. The larger the voltage between the charge injection section and the charge storage section 358, the larger the gain β(m).

Because the accumulated signal charge β(m)×m in the charge storage section decreases its voltage and also reduces the voltage difference between the charge injection section 352 and the charge storage section 358, an electric potential barrier that controls charge injection of the charge amplification section rises to decrease the charge injection. Although FIG. 3B illustrates charge storage section, there may be an electron hole storage section and an electron storage section.

Figure 4:
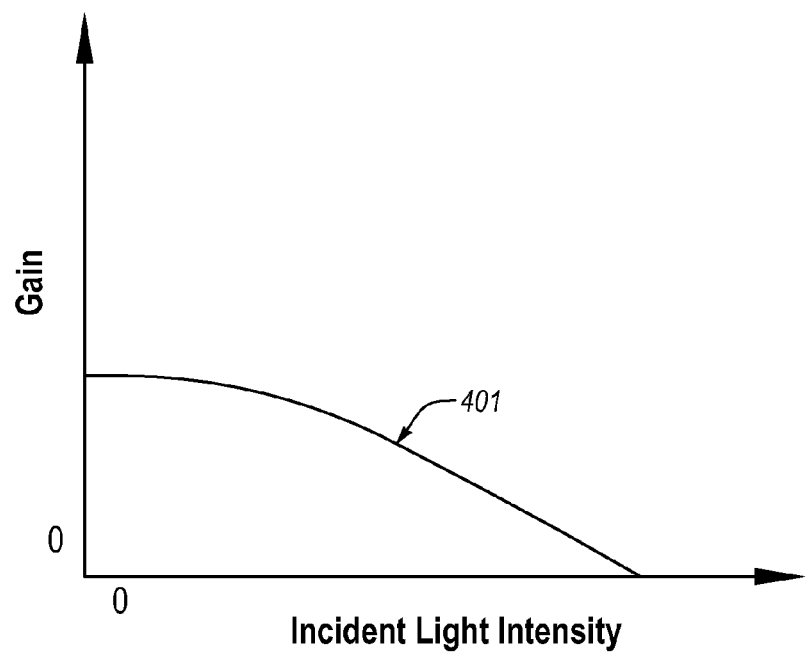
FIG. 4 shows a graph of a non-linearly varying gain function applied by an example low light adaptive photoelectric imaging device that is arranged in accordance with at least some examples described herein.
Figure 5:
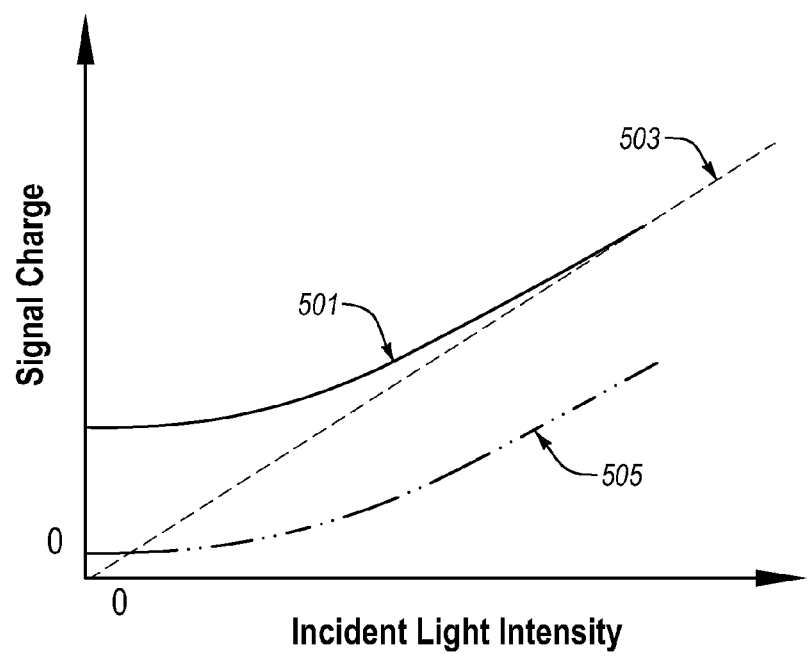
FIG. 5 shows a graph of signal and noise curves associated with a low light adaptive photoelectric imaging device that is arranged in accordance with at least some examples described herein and that implements the non-linearly varying gain function of FIG. 4.

FIGS. 4-5 illustrate graphically the amplification functions. FIG. 4 shows a graph of a non-linearly varying gain function applied by an example low light adaptive photoelectric imaging device that is arranged in accordance with at least some examples described herein. FIG. 5 show graphs of signal and noise curves associated with a low light adaptive photoelectric imaging device that is arranged in accordance with at least some examples described herein and that implements the non-linearly varying gain function of FIG. 4.

In each graph in FIGS. 4 and 5, the horizontal axis represents an incident light intensity. In FIG. 4, the vertical axis represents a gain level and curve 401 represents a non-linearly varying gain function applied by an example embodiment of a low light adaptive photoelectric imaging device. In FIG. 5, the vertical axis represents an amount of charge and a first curve 501 represents an amount of charge in a signal output by the low light adaptive photoelectric imaging device having the gain function represented by a substantially non-linear gain curve 401. A second curve 503 in FIG. 5 represents an amount of charge in a signal output by a conventional photoelectric imaging device having a substantially constant gain (i.e., linear amplification), while a third curve 505 represents an amount of charge generated due to noise in the low light adaptive photoelectric imaging device that applies the non-linear gain curve 401.

As shown in FIG. 4, the non-linear gain function illustrated by the curve 401 has an inverse relationship with respect to variations of incident light intensity. For example, the lower the incident light intensity is, the larger the gain is; and the higher the incident light intensity is, the smaller the gain is. Accordingly, a signal output by a low light adaptive photoelectric imaging device that employs the non-linear gain function is less likely to exceed a permissible dynamic range when a high illumination signal is input to the device. Moreover, the non-linearly varying gain function can be utilized to increase an amount of gain applied when low intensity light is input to the device.

The non-linear gain function illustrated by curve 401 may be expressed as a function β(m) of a number m of photo-carriers generated in response to incident light. A signal charge S in an output signal may be expressed approximately as S=β(m)·m. A noise charge N may be expressed approximately as N=$\sqrt{\beta(m) \cdot m}$, which corresponds to noise curve 505.

The S/N ratio of the low light adaptive photoelectric imaging device is determined by dividing the signal charge S with the noise charge N, which results in S/N=$\sqrt{\beta(m) \cdot m}$. The functions may also be offset by a constant in some embodiments. At low levels of incident light intensity $\sqrt{\beta(m)}$ is larger than a linear amplification gain constant and the corresponding S/N ratio at low levels of incident light intensity is larger than that resulting from linear amplification. For example, if m=10, then β(m)=100 and S/N=100. Similarly, if m=100, S/N=30. This demonstrates that the amplification of low intensity light signals is possible while the amplification of noise at low intensity light levels is suppressed or reduced.

Figure 6:
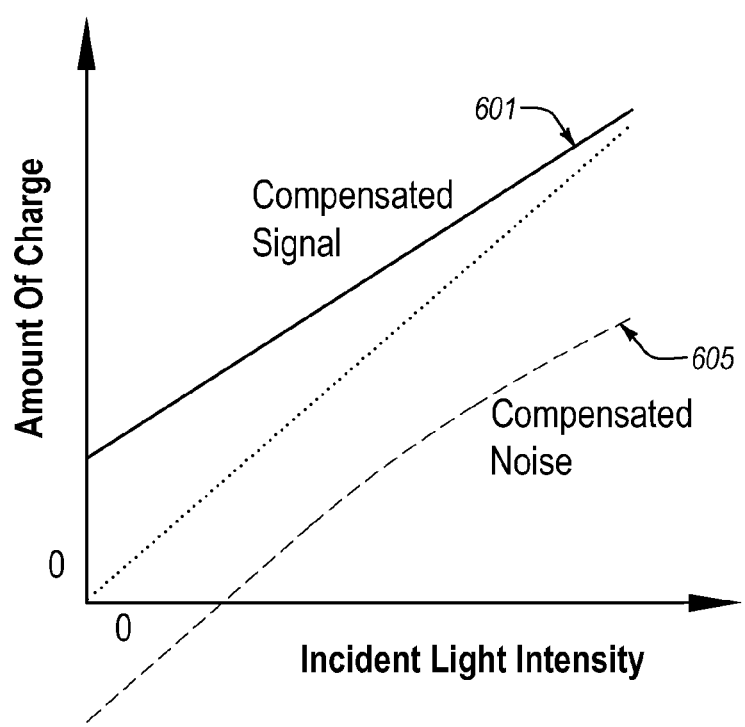
FIG. 6 shows graphs of compensated signal and noise curves associated with a low light adaptive photoelectric imaging device that is arranged in accordance with at least some examples described herein and that implements the non-linearly varying gain function of FIG. 4.

FIG. 6 shows graphs of compensated signal and noise curves associated with a low light adaptive photoelectric imaging device that is arranged in accordance with at least some examples described herein and that implements the non-linearly varying gain function of FIG. 4. The graph shown in FIG. 6 illustrates compensated signal curve 601 and compensated noise curve 605, corresponding to uncompensated signal curve 501 and uncompensated noise curve 505, respectively, after an image processing compensation procedure has been carried out. For example, the signal curve 501 from FIG. 5 may be transformed into a compensated signal curve 601 as a result of transforming imaging signals obtained from an example low light adaptive photoelectric imaging device into video signals that are used by video monitors or television sets. This noise suppression characteristic resembles the Dolby signal processing effect used in music equipment. For example, when causing a television set to display the image signals, the electrical signals may be rendered linearly. The signal 501 is converted using signal processing to render the signals in a linear manner. The signal curve 501 is converted to the compensated signal 601. The noise curve 505 is converted in a similar manner.

The photoelectric conversion imaging device 304 can be arranged in various configurations that include gate regions, source regions, and drain regions. During photoelectric conversion, an intrinsic gate is formed. The intrinsic gate becomes an electric potential barrier that can prevent electrons from flowing. The intrinsic gate can be controlled, in one embodiment, by electrons and electron holes. In another example, the intrinsic gate can be controlled by electron holes. The following discussion illustrates example circuit layouts of a photoelectric conversion imaging device.

FIG. 7 is a plan view of a first example circuit layout of a photoelectric conversion imaging device of the imaging apparatus in FIG. 3 that is arranged in accordance with at least some examples described herein. FIG. 8 is a first cross-sectional view of the first example circuit layout of FIG. 7 that is arranged in accordance with at least some examples described herein. FIG. 9 is a second cross-sectional view of the first example circuit layout of FIG. 7 that is arranged in accordance with at least some examples described herein.

More specifically, FIG. 8 illustrates a cross-sectional view from the position of a plane perpendicular to the page and intersecting the circuit layout of FIG. 7 at a line y-y', while FIG. 9 illustrates a cross-sectional view from the position of a plane perpendicular to the page and intersecting the circuit layout of FIG. 7 at a line x-x'.

As shown in FIGS. 7-9, the photoelectric conversion imaging device 304 may include a signal amplifying phototransistor with a source region 702, two gate regions 704, and a drain region 706, among other things. The source, gate, and drain regions may be formed by doping portions of an intrinsic region 708 to form extrinsic regions of an n or p type of semiconductor material. Intrinsic region 708 may be formed in a p-type well 710, which in turn may be formed on an n-type substrate 712. In some embodiments, intrinsic region 708 may be constantly depleted due to its relatively low dopant impurity.

FIG. 10 is a plan view of the first example circuit layout of FIG. 7 further including a light-masking layer that is configured effective to pass incident light to certain regions or portions of the photoelectric conversion imaging device in accordance with at least some examples described herein. FIG. 11 is a first cross-sectional view of the example circuit layout of FIG. 10 that is arranged in accordance with at least some examples described herein. FIG. 12 is a second cross-sectional view of the example circuit layout of FIG. 10 that is arranged in accordance with at least some examples described herein.

In some alternative embodiments such as shown in FIGS. 10-12 (corresponding to FIGS. 7-9), a light-masking layer 714 may be formed over the foregoing extrinsic regions and intrinsic region effective to pass incident light to specific regions, such as gate regions 704 or portions thereof. Accordingly, other regions can be effectively blocked from exposure to incident light by the light-masking layer 714. Blocking incident light may reduce stray noise that may be attributed to the incident light. In this illustrative example gate regions 704 are shown as having substantially the same or similar shape as each other and are bilaterally symmetrical with respect to line x-x'. However, gate regions 704 may differ in shape and/or size with respect to each other. Moreover, in some embodiments, a single gate region 704 may be included in the circuit layout.

Source region 702 is an extrinsic region that may be formed in intrinsic region 708 by heavily doping a portion of intrinsic region 708 with an n-type impurity (denoted n+ in FIG. 7). Gate regions 704 may be extrinsic regions formed in intrinsic region 708. However, gate regions 704 may be formed by lightly doping a portion of intrinsic region 708 with a p-type impurity (denoted p− in FIG. 7). Drain region 706 can be another extrinsic region formed in intrinsic region 708, e.g., by moderately doping a portion of intrinsic region 708 with an n-type impurity (denoted n in FIG. 7).

Source region 702 may be initially biased at a source bias voltage Vs that can be applied to source region 702. The doping density of source region 702 can be set relatively high and the source bias voltage Vs can be set low enough such that source region 702 is not substantially depleted of carrier electrons during initialization. Moreover, an initial gate bias voltage Vg can be applied to gate regions 704. Gate regions 704 may be doped with a lighter doping density than source region 702 and the initial gate bias voltage Vg may be set low enough, depending on how lightly gate regions 704 are doped, such that gate regions 704 are substantially depleted of carrier holes during the initializing mode.

In addition, an initial drain voltage Vd may be applied to drain region 706. The initial drain voltage Vd may be set higher than the source bias voltage Vs. Drain region 706 may be doped with a lighter doping density than source region 702 and the initial drain bias voltage Vd may be set high enough, depending on how lightly drain region 706 is doped, such that drain region 706 is substantially depleted of carrier electrons during the initializing mode.

The source bias voltage Vs and the gate bias Vg may be set effective to reverse bias gate regions 704 with respect to source region 702, and the bias voltages Vs and Vg may be set effective to forward bias drain region 706 with respect to the source region 702. Accordingly, the new phototransistor of photoelectric conversion imaging device 304 may be configured to operate as an n-channel depletion mode transistor in which the majority carriers are electrons flowing from source region 702 to drain region 706.

The gate bias voltage Vg may be applied via selective activation of first and second transistor switches formed by gate regions 704, a corresponding pair of secondary gate regions 716, and a corresponding pair of gate electrodes 718. Similarly, drain bias voltage Vd may be applied via selective activation of a third transistor switch formed by drain region 706, a secondary drain region 720, and a gate electrode 722. The gate electrode 722 may be biased by a voltage Vnr, which may be a forward bias voltage that is larger than bias voltage Vs. Each gate electrode 718, which may be biased by a voltage Vpr (which may be reverse biased to Vs) may be formed between one of gate regions 704 and a corresponding one of secondary gate regions 716. Moreover, gate electrode 722 may be formed between drain region 706 and secondary drain region 720. Secondary gate regions 716 may be more heavily doped with the p-type impurity (denoted p+ in FIG. 7) than gate regions 704. Similarly, secondary drain region 720 may be more heavily doped with the n-type impurity (denoted n+ in FIG. 7) than drain region 706.

During initialization, gate electrodes 718 and gate electrode 722 may be selectively activated to apply the bias voltages Vg and Vd to corresponding gate and drain regions 704 and 706, respectively. For example, vertical scanning control circuitry 316 can control vertical scanning control lines 318 to selectively activate one or more of gate electrodes 718 and 722 during the initializing mode of operation to apply the bias voltages Vg and Vd. Application of the bias voltages Vg and Vd can result in formation of an intrinsic gate 724 within intrinsic region 708 at a cross-point of line x-x' and line y-y'.

Figure 13:
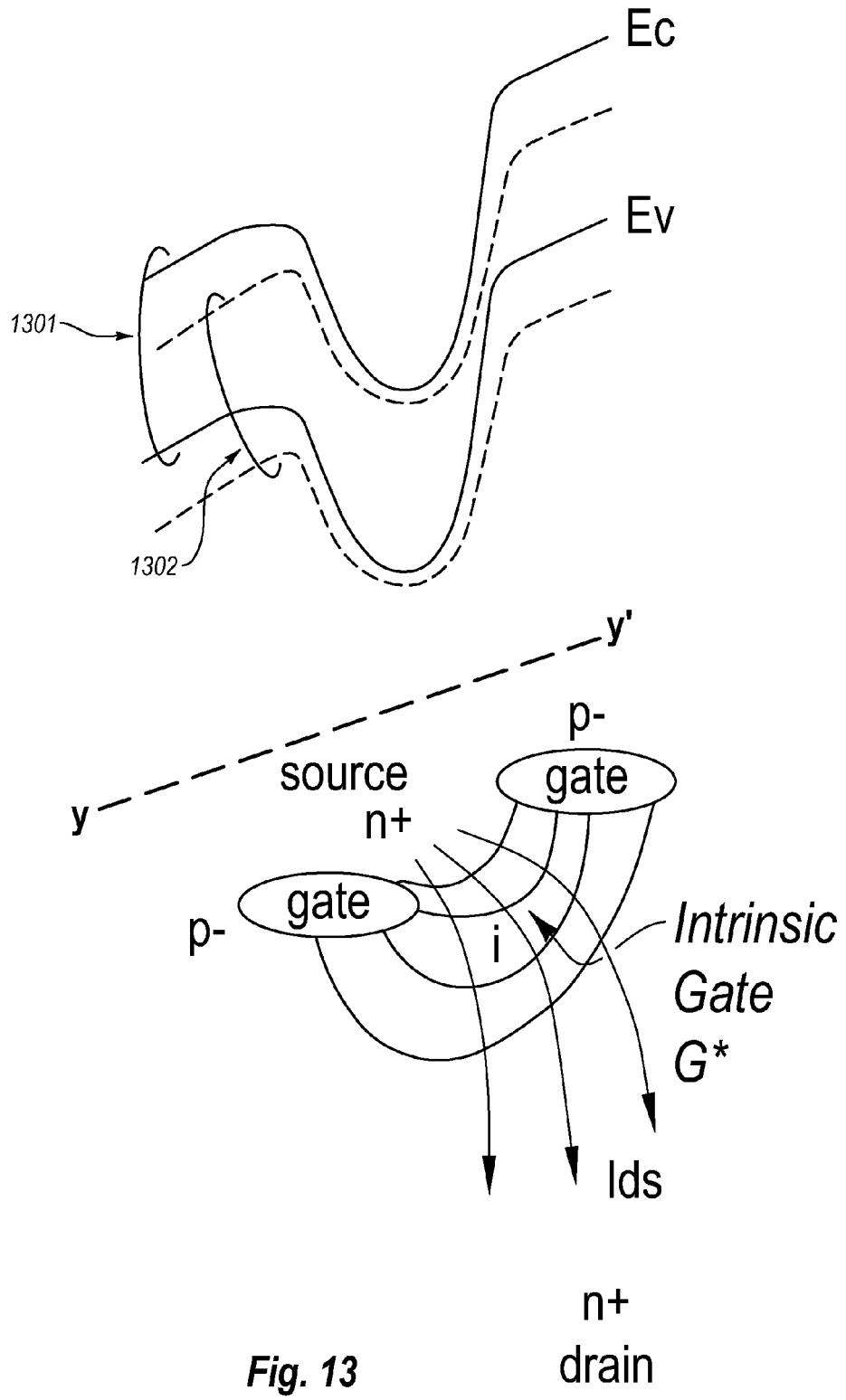
FIG. 13 shows an electron potential distribution diagram and energy band diagrams corresponding to the second cross-sectional view of the first example circuit layout of FIG. 9 that is arranged in accordance with at least some examples described herein.
Figure 14:
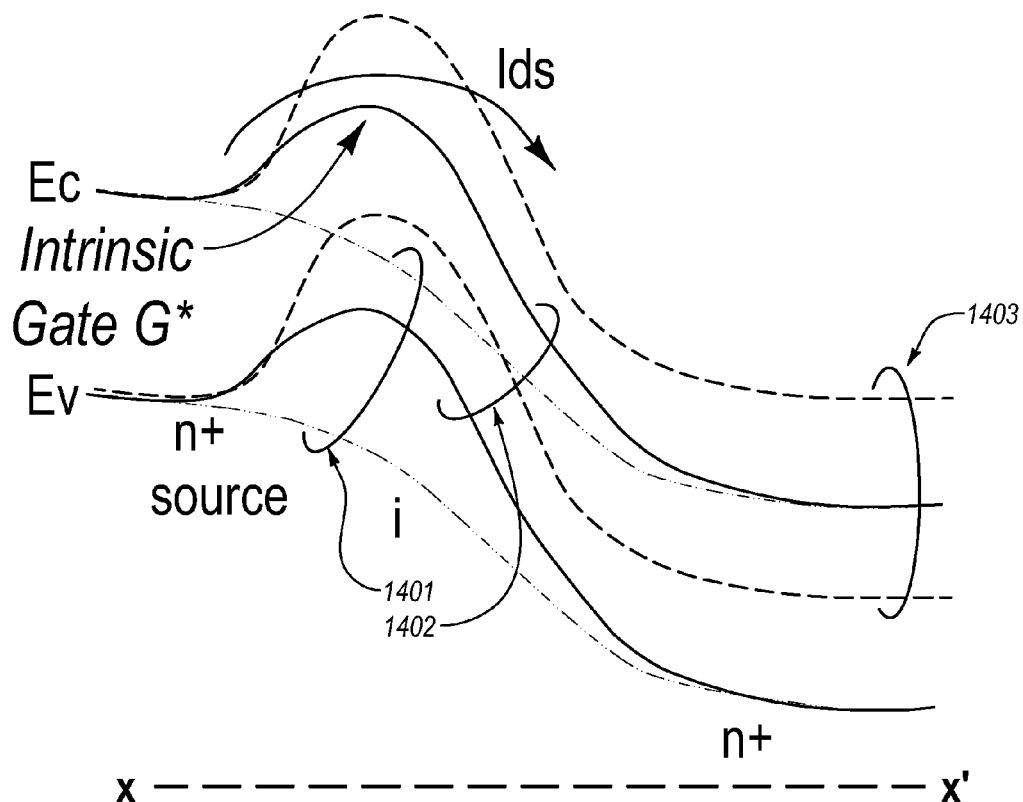
FIG. 14 shows energy band diagrams corresponding to the first cross-sectional view of the first example circuit layout of FIG. 8 that is arranged in accordance with at least some examples described herein.
Figure 15:
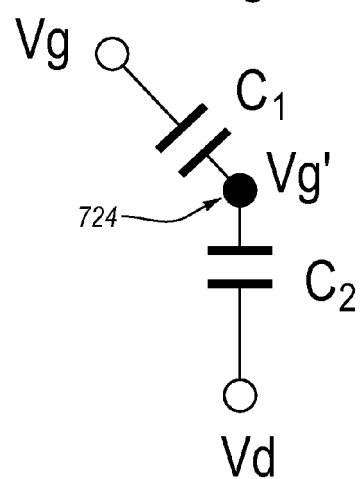
FIG. 15 shows a circuit diagram representation of two depletion capacitances arranged in series within the photoelectric conversion imaging device of the imaging apparatus depicted in FIG. 3 that is arranged in accordance with at least some examples described herein.

FIG. 13 shows an electron potential distribution diagram and energy band diagrams corresponding to the second cross-sectional view of the first example circuit layout of FIG. 9 that is arranged in accordance with at least some examples described herein. FIG. 14 shows energy band diagrams corresponding to the first cross-sectional view of the first example circuit layout of FIG. 8 that is arranged in accordance with at least some examples described herein. FIG. 15 shows a circuit diagram representation of two depletion capacitances arranged in series within the photoelectric conversion imaging device of the imaging apparatus depicted in FIG. 3 that is arranged in accordance with at least some examples described herein.

FIGS. 13-15 are diagrams that illustrate the presence of intrinsic gate 724 and its effect on a drain to source current (Ids) in the phototransistor of photoelectric conversion imaging device 304. A bottom portion of FIG. 13 depicts an electron potential distribution diagram corresponding to the y-y' cross-section in the phototransistor of photoelectric conversion imaging device 304. A top portion of FIG. 13 depicts different sets of conductive and valence hole energy band diagrams corresponding to the y-y' cross-section in the phototransistor of photoelectric conversion imaging device 304. FIG. 14 depicts different sets of conductive and valence electron energy band diagrams corresponding to the x-x' cross-section in the phototransistor of photoelectric conversion imaging device 304. (Each set of conductive and valence energy band diagrams depicted in FIGS. 13 and 14 corresponds to a different set of operating conditions, as explained in further detail below.) FIG. 15 depicts a circuit diagram representation of two depletion capacitances, $C_1$ and $C_2$, arranged in series between gate regions 704 and drain region 706 of the phototransistor of photoelectric conversion imaging device 304. Intrinsic gate 724 is located between the two depletion capacitances $C_1$ and $C_2$.

When the source bias voltage Vs is applied to source region 702 and a forward bias voltage corresponding to the drain bias voltage Vd is applied to secondary drain region 720, intrinsic gate 724 and a corresponding electric potential barrier has not yet been formed. The absence of the electric potential barrier is illustrated by a first set of conductive and valence energy band curves 1401 in FIG. 14. Subsequently a backward bias voltage corresponding to the gate bias voltage Vg is applied to gate regions 704 and consequently curves 1401 change to a second set of curves 1402 in FIG. 14, thereby forming the electric potential barrier of intrinsic gate 724. Also, a first set of conductive and valence energy band curves 1301 along the y-y' cross-section shown in FIG. 13 illustrate the Ids channel formed between gate regions 704 when the gate bias voltage Vg is applied to the gate region 704.

The electric potential barrier can restrict the flow of electrons from source region 702 to drain region 706, thereby restricting an amount of the drain-to-source current, Ids, in proportion to incident light intensity on the photoelectric conversion imaging device 304. The electric potential barrier may vary its restriction on the flow of electrons in dependence on incident light intensity in accordance with non-linear gain curve 401 in FIG. 4.

When the gate bias voltage Vg and drain bias voltage Vd are applied, a first depletion region can be formed between intrinsic gate 724 and gate regions 704 and a second depletion region can be formed between intrinsic gate 724 and drain region 706. Moreover, the first depletion region has an associated depletion capacitance $C_1$ and the second depletion region has an associated depletion capacitance $C_2$, as shown in FIG. 15. Depletion capacitance $C_1$ may have a value that is determined by an amount of holes associated with the gate regions 704. The amount of holes may depend on the doping density of gate regions 704. Similarly, depletion capacitance $C_2$ may have a value that is determined by an amount of electrons associated with the drain region 706, which depends on the doping density of drain region 706.

Dopant concentration levels and the geometries of gate regions 704 and drain region 706 are configured so that the value of depletion capacitance $C_1$ of gate regions 704 is less than the value of depletion capacitance $C_2$ of drain region 706. Moreover, an intrinsic gate voltage Vg' can be determined based on the values of depletion capacitances $C_1$ and $C_2$.

During amplification, gate electrodes 718 and 722 may be de-activated in response to various control signals to allow voltage levels at drain region 706 and gate regions 704 to float. As will be illustrated in further detail below with reference to FIGS. 16-19, the gate regions 704 and drain region 706 may store positive and negative charge, respectively, at low intensity levels of incident light. In FIG. 7, electrical charge accumulates in the gate photoelectric conversion region 704 and in the drain photoelectric conversion region 706. The accumulated charge, however, can be different. For example, photons incident in the gate region generate electron holes. Photons incident in the drain region also generate corresponding electron holes. However, due to the amplification effects for a given amplification rate (e.g., amplification rate m) from the intrinsic region, electrons in the number of m-fold of the electron holes flow from the source region to the drain region. As a result, electrons accumulate in the drain region.

The balance between the positive and negative charge is illustrated by the energy band curves in a top portion of FIG. 13 and FIG. 14. Since a value of depletion capacitance $C_1$ is less than a value of depletion capacitance $C_2$, the electron energy band curves 1402 in FIG. 14 may change while the hole energy band curves 1301 may change to curves 1302.

Consequently, the electric potential of intrinsic gate 724 can decrease, resulting in a relatively high flow of electrons from source region 702 to drain region 706 and resulting in a correspondingly high drain-to-source current Ids. The flow of the drain-to-source current Ids is shown in a bottom portion of FIG. 13 and FIG. 14.

As incident light intensity increases on the photoelectric conversion imaging device 304 the electric potential barrier increases and the gain decreases because the depletion capacitance $C_2$ is able to store more charge than the depletion capacitance $C_1$. The decrease in gain corresponds to the non-linear gain function 401 illustrated in FIG. 4. The decreased gain and increased electric potential barrier at high levels of incident light intensity are illustrated in FIG. 14 by the electron energy band curves 1402 changing to curves 1403. Consequently, the electric potential of intrinsic gate 724 may rise to suppress the flow of electrons from source region 702 to drain region 706, and the amplification of a signal charge corresponding to high intensity light can eventually decrease.

Figure 16:
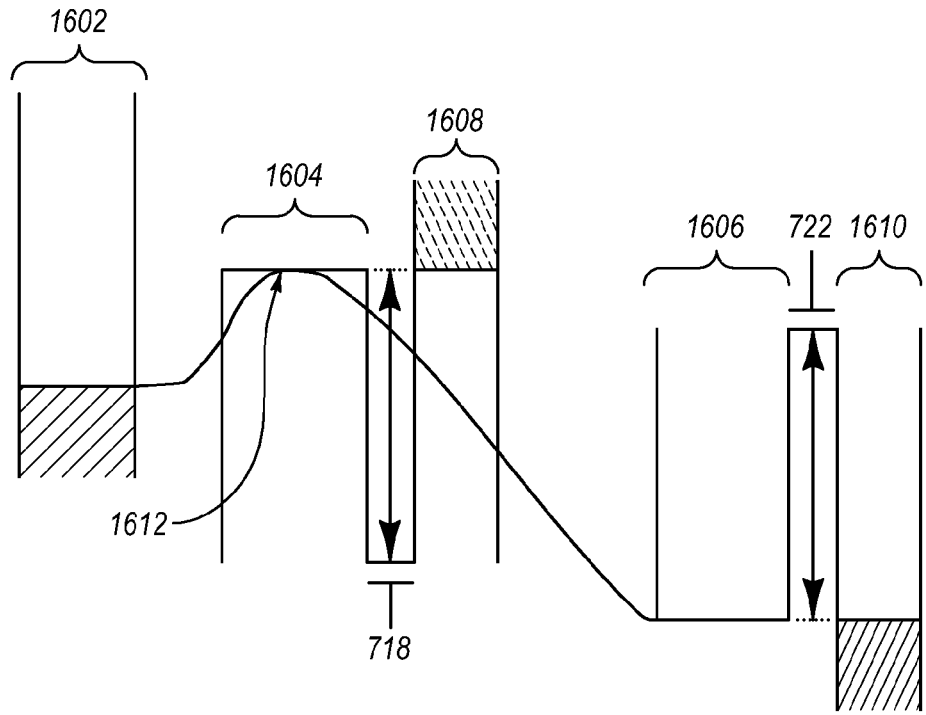
FIG. 16 shows a state of electric potential levels in the photoelectric conversion imaging device prior to exposure of incident light to the photoelectric conversion imaging device that is arranged in accordance with at least some examples described herein.
Figure 17:
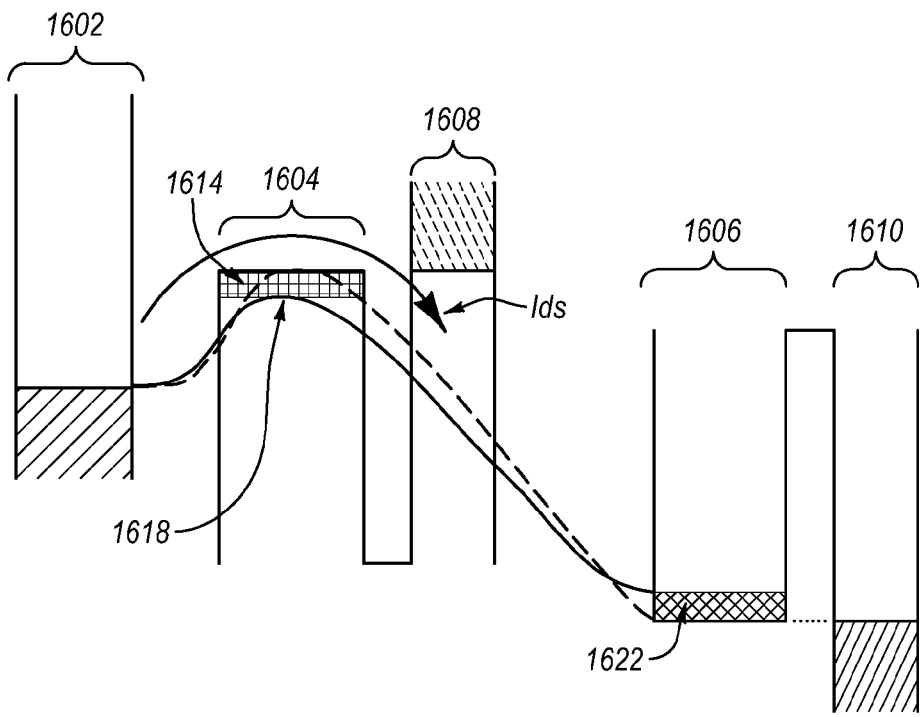
FIG. 17 depicts a state of electric potential levels in the photoelectric conversion imaging device in which low intensity light becomes incident on the photoelectric conversion imaging device that is arranged in accordance with at least some examples described herein.
Figure 18:
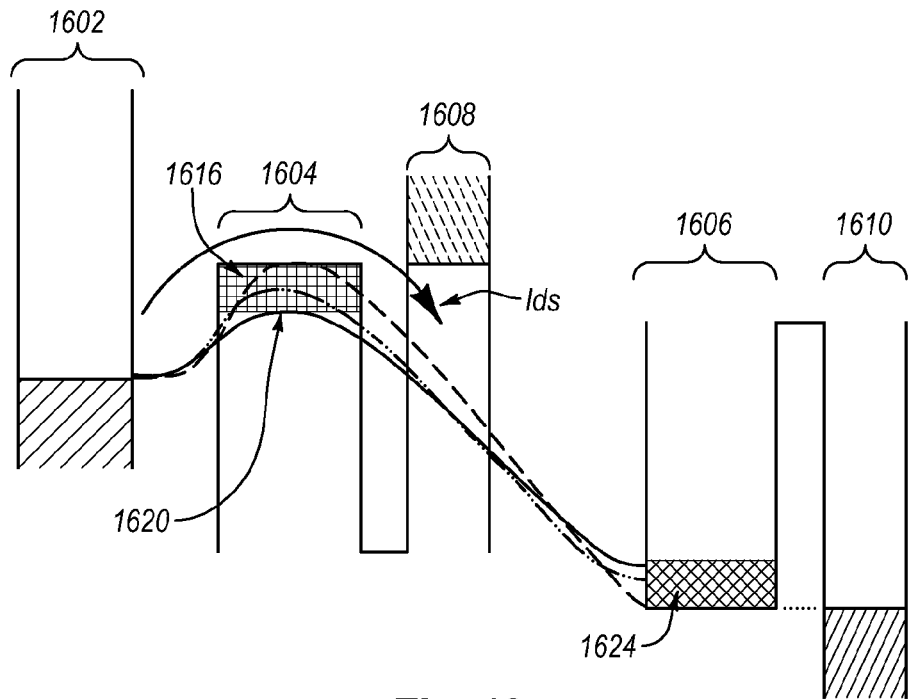
FIG. 18 depicts a state of electric potential levels in the photoelectric conversion imaging device in which moderate intensity light becomes incident on the photoelectric conversion imaging device that is arranged in accordance with at least some examples described herein.
Figure 19:
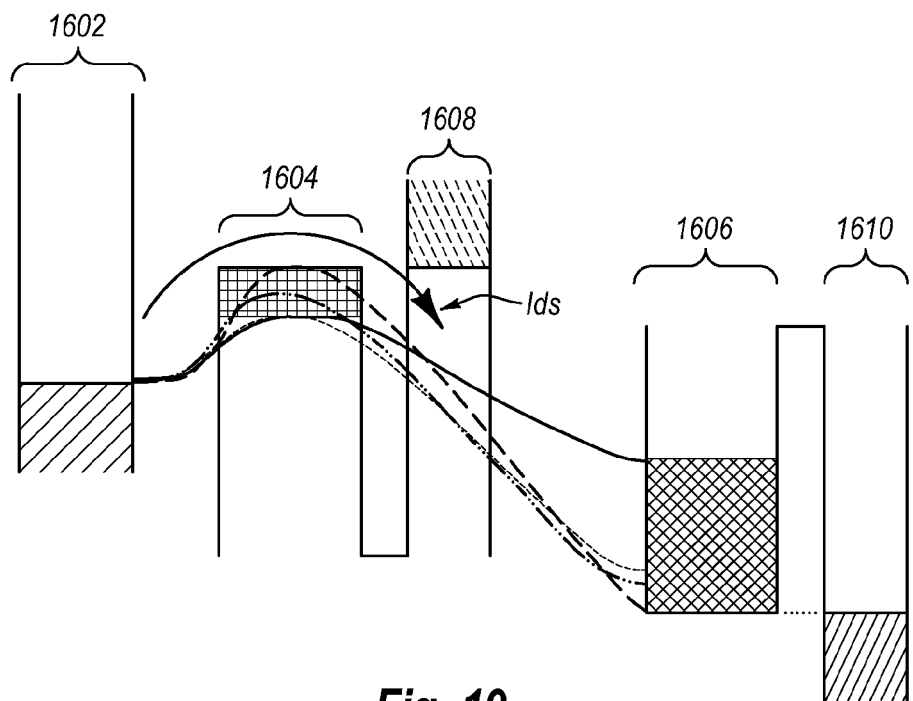
FIG. 19 depicts a state of electric potential levels in the photoelectric conversion imaging device in which high intensity light is incident on the photoelectric conversion imaging device that is arranged in accordance with at least some examples described herein.

The growth of the electric potential barrier in response to increased light intensity is illustrated graphically by a set of simulated electric potential diagrams in FIGS. 16-19. FIG. 16 shows a state of electric potential levels in the photoelectric conversion imaging device prior to exposure of incident light to the photoelectric conversion imaging device that is arranged in accordance with at least some examples described herein. FIG. 17 depicts a state of electric potential levels in the photoelectric conversion imaging device in which low intensity light becomes incident on the photoelectric conversion imaging device that is arranged in accordance with at least some examples described herein. FIG. 18 depicts a state of electric potential levels in the photoelectric conversion imaging device in which moderate intensity light becomes incident on the photoelectric conversion imaging device that is arranged in accordance with at least some examples described herein. FIG. 19 depicts a state of electric potential levels in the photoelectric conversion imaging device in which high intensity light is incident on the photoelectric conversion imaging device that is arranged in accordance with at least some examples described herein.

More specifically, FIG. 16 depicts a first state of electric potential levels in the phototransistor of photoelectric conversion imaging device 304, in which drain region 706 and gate regions 704 have been charged and are then floated, but prior to exposure of incident light on the photoelectric conversion imaging device. Electric potentials 1602, 1604, and 1606 at source region 702, gate regions 704, and drain region 706, respectively, can be adjusted effective to form the electric potential barrier that suppresses the flow of electrons from source region 702 to drain region 706. Moreover, electric potential 1604 can initially be set in correspondence to a hole electric potential 1608 in secondary gate regions 716 by activation of gate electrodes 718. Similarly, electric potential 1606 can initially be set in correspondence to an electron electric potential 1610 in secondary drain region 720 by activation of gate electrode 722. Electric potentials 1604 and 1606 of gate regions 704 and drain region 706, respectively, are then floated by de-activating their corresponding electrodes. (Electric potential 1604 of gate regions 704 is shown in a simplified manner, however, for purposes of explaining how hole accumulation influences an electric potential 1612 of intrinsic gate 724.)

FIGS. 17 and 18 depict a second state of electric potential levels in the phototransistor in which light becomes incident on gate regions 704, causing holes to be accumulated in gate regions 704. An initial accumulation of holes is depicted at 1614 in FIG. 17 and increasing accumulation of holes, if incident light is sufficiently intense, is depicted at 1616 in FIG. 18. As holes are accumulated in gate regions 704, the electric potential barrier at intrinsic gate 724 may lower from its initial level 1612 to a lower level 1618, as shown in FIG. 17, and, if incident light is sufficiently intense, to an even lower level 1620, as shown in FIG. 18. The lowering of the electric potential barrier at intrinsic gate 724 may cause electrons to be injected from source region 702 to drain region 706. Consequently, electrons can be accumulated in drain region 706. The accumulation of electrons is depicted at 1622 in FIGS. 17 and 1624 in FIG. 18.

FIG. 19 depicts a third state of electric potential levels in the phototransistor in which high intensity light is incident on gate regions 704. As shown in FIG. 19, gate regions 704 can eventually become saturated and no longer accumulate holes even though drain region 706 continues to accumulate electrons. Consequently, injection and amplification of electrons flowing from source region 702 to drain region 706 may decrease and may halt when the gate regions 704 become saturated.

Figure 20:
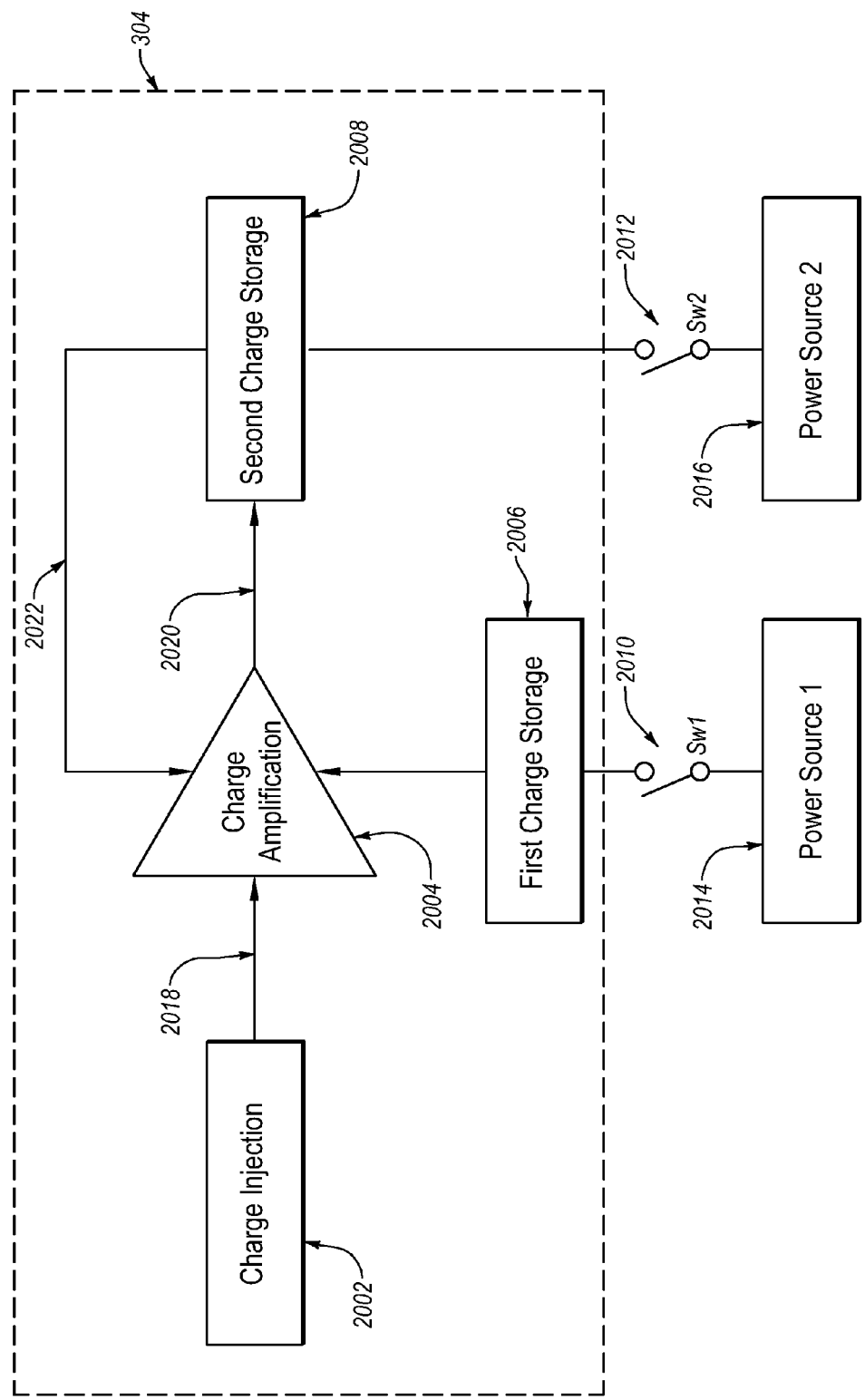
FIG. 20 depicts a conceptual block diagram of the photoelectric conversion imaging device and additional circuitry that are arranged in accordance with at least some examples described herein.

FIG. 20 depicts a conceptual block diagram of the photoelectric conversion imaging device and additional circuitry that are arranged in accordance with at least some examples described herein. As shown in FIG. 20, the photoelectric conversion imaging device 304 may include a charge injection section 2002, a charge amplification section 2004, a first charge storage section 2006 adapted to store charge of a first polarity, and a second charge storage section 2008 adapted to store charge of a second polarity opposite the first polarity. An electric potential barrier of the charge amplification section, which affects the gain applied by charge amplification section 2004, may depend at least in part on the electric potentials of first and second charge storage sections 2006 and 2008.

Prior to photoelectric conversion of incident light, a pair of first and second switches 2010 and 2012 (corresponding to gate electrodes 718 and 722, respectively) can be selectively activated (i.e., closed or operated in a closed circuit position) by an external controller. When activated, first switch 2010 is effective to couple an electric potential from a first power supply 2014 to first charge storage section 2006. Similarly, second switch 2012, when activated, is effective to couple an electric potential from a second power supply 2016 to second charge storage section 2008. First and second switches 2010 and 2012 can be selectively de-activated (i.e., opened or operated in an open circuit position) to electrically float first and second charge storage sections 2006 and 2008.

Then, when light is incident on gate regions 704 of the phototransistor, photo-carriers can be generated by a photoelectric conversion process and, consequently, a charge m can be injected from charge injection section 2002 to charge amplification section 2004, as indicated by a first arrow 2018. Charge amplification section 2004 is configured to amplify the charge m by a factor $\beta(m)$ that is a function of the charge m and the amplified charge may be stored in second charge storage section 2008, as indicated by a second arrow 2020. More specifically, incident photons (e.g., m photons) on the gate regions 704 are photoelectrically converted by the gate regions 704. Electron holes (m electron holes) are accumulated in the first charge storage section 2006. In the charge amplification section 2004, which is operable to realize amplification effects by the intrinsic gate, electrons in a number of $\beta(m)$ flow from the source regions 702, or the charge injection section 2002 to the drain regions 706 or the second charge storage section 2008. This feedback from second charge storage section 2008 to charge amplification section 2004 is conceptually represented in FIG. 20 by a third arrow 2022.

As noted above, the amplification factor $\beta(m)$ of charge amplification section 2004 may depend, at least in part, on the electric potential of second charge storage section 2008. More specifically, the amplification factor $\beta(m)$ causally depends on the electric potential difference between the charge injection section 2002 and the second charge storage section 2008. The closer the electrical potential of second charge storage section 2008 is to that of charge injection section 2002, the smaller the electric potential difference will be and, accordingly, the smaller the amplification factor $\beta(m)$ will be. Similarly, the larger the electric potential difference is, the larger the amplification factor $\beta(m)$ will be. Therefore, if incident light intensity is low the charge stored in second charge storage section 2008 will be low and the amplification factor $\beta(m)$ will be higher than if the incident light intensity were high, and vice-a-versa.

The non-linear and non-equilibrated drop of gain due to the electrical floating condition may be termed a "sudden braking effect" due to its resemblance to a decrease in car speed when a brake pedal is stepped on. When the photo-carriers (whether they be electrons or holes) generated by the photoelectric conversion of weak light mentioned above are multiplied by the non-linear and non-equilibrated amplification process to form groups of photo-carriers, the non-linear and non-equilibrated process may result in a unique resonant phenomenon of photo-carriers, which may be termed a "drawing effect," due to their wave nature, and these multiplied photo-carriers show a strong correlation with their wave functions. The difference between the photo-carriers generated by the incident light and the multiplied photo-carriers is reduced, and as a result, signal charge fluctuations are reduced, which suppresses heat fluctuations (thermal noise) that stem from incident photons by a factor of $\sqrt{\beta(m)}$ or more.

The foregoing description is directed mainly to a first type of embodiment of a new phototransistor for use in photoelectric conversion imaging device 304. However, other embodiments and modifications to the foregoing first embodiment are also contemplated. For example, in one example modification, generation of dark current may be inhibited by covering gate regions 704 with a semiconductor material having an opposite polarity type than gate regions 704. The dark current inhibiting semiconductor material may be formed by doping an upper surface of gate regions 704.

Another alternative embodiment of photoelectric conversion imaging device 304 may include a phototransistor having multiple different light receiving regions or sections. For example, gate regions 704 may be reduced in size and drain region 706 may be correspondingly increased in size to receive incident light. Thus, drain region 706 may be a photosensitive region that, when exposed to light, generates photo-carriers.

FIG. 21 is a plan view of a second example circuit layout of the photoelectric conversion imaging device of FIG. 3 that is arranged in accordance with at least some examples described herein. The second example circuit layout of FIG. 21 is of a phototransistor having more than one light receiving section. For example, drain region 706' is increased in size relative to that of the first example described above with respect to FIG. 7 and gate regions 704' are decreased in size.

FIG. 22 is a first cross-sectional view of the second example circuit layout of FIG. 21 that is arranged in accordance with at least some examples described herein. FIG. 23 is a second cross-sectional view of the second example circuit layout of FIG. 21 that is arranged in accordance with at least some examples described herein. More specifically, FIG. 22 illustrates a cross-sectional view from the position of a plane perpendicular to the page and intersecting the circuit layout of FIG. 21 at a line y-y', while FIG. 23 illustrates a cross-sectional view from the position of a plane perpendicular to the page and intersecting the circuit layout of FIG. 21 at a line x-x'.

FIG. 24 is a plan view of the second example circuit layout of FIG. 21 in which an example light-masking layer passes incident light to certain regions or portions of the photoelectric conversion imaging device that is arranged in accordance with at least some examples described herein. FIG. 25 is a first cross-sectional view of the example circuit layout of FIG. 24 that is arranged in accordance with at least some examples described herein. FIG. 26 is a second cross-sectional view of the example circuit layout of FIG. 24 that is arranged in accordance with at least some examples described herein.

As shown in FIGS. 24-26 (corresponding to FIGS. 21-23), light-masking layer 714 may also be formed over the foregoing extrinsic regions and intrinsic region effective to pass incident light to specific regions, such as gate regions 704' and drain region 706' or portions thereof. Accordingly, other regions may be effectively blocked from exposure to incident light, thereby reducing stray noise. The light-masking layer 714 is effective to block light from regions over which the light-masking layer is formed. By blocking incident light, stray noise is reduced. Furthermore, generation of dark current may be inhibited by covering gate regions 704' with a semiconductor material having an opposite polarity type than gate regions 704' and by covering drain region 706' with a semiconductor material having an opposite polarity type than drain region 706'. The dark current inhibiting semiconductor materials may be formed by doping upper surfaces of gate regions 704' and drain region 706'.

The circuit layout of FIGS. 21-23 may provide somewhat more flexibility in certain respects with regard to designing the gain function of the phototransistor than the circuit layout shown in FIGS. 7-9. More specifically, in the embodiment of FIGS. 7-9, specific regions, such as gate regions 704 may be exposed to light. Optimizing the gain function can be done by modifying the design of gate regions 704. In the embodiment of FIGS. 21-23, both gate regions 704 and drain region 706 can be modified to optimize and achieve a desired gain function.

The intrinsic gate G* is formed near the intersection of the x-x' axis and the y-y' axis. The intrinsic gate G* 724' may be formed inside of intrinsic region 708'. When the initializing voltages are applied to n+ region 702' and the n− region 706', an electric potential barrier is not formed. This is illustrated by the curves 1401 in the energy band diagrams of FIG. 14. When an initializing voltage is applied to the p− region 716', curves 1301 of the energy band diagram for the y-y' cross section forms. Also, the curves 1401 change to curves 1402 (dotted lines). As a result, the intrinsic gate G* 724' is formed. The intrinsic gate G* becomes an electric potential barrier that prevents electrons from flowing from n+ region 702' to n− region 706'. Because the voltage of the intrinsic gate G* 724' is determined by the capacitive coupling between capacity Cp− of the hole storage p− region 716' and capacity Cn+ of electron storage n− region 706', the electric potential barrier can be determined according to the gain 401 in FIG. 4.

In one example, the hole storage p− region 716' controls the gain in the low illumination range and the electron storage n− region 706' control the gain in the high illumination range. In this case, the capacity Cp−<Cn−.

When weak light is incident on the photoelectric conversion element 304, holes are accumulated in the hole storage p− region 716' and electrons are accumulated in the electron storage n− region 706'. Since Cp−<Cn−, the electron energy band curves 1402 barely change, while the hole energy band curves 1301 change to the curves 1302. As a result, the electric potential barrier of the intrinsic gate G* 724' against electrons decreases and the number of accumulated holes m multiplied by the number of β(m) create a current Ids that flows from the n+ region 702' to the n− region 706'. The signal charge in the low illumination range is the number of electrons βm which have been amplified and injected from the n+ region 702' to the n− region 706'.

In contrast, when high intensity light is incident on the photoelectric conversion imaging element 304, holes are accumulated in the hole storage p− region 716' and electrons are accumulated in the electron storage n− region 706'. Because Cp−<Cn−, the hole energy band curves 1301 change to the curves 1302. At the same time, a number of electrons are accumulated in the n− region 706' and the electron energy band curves 1402 change to the curves 1401. In this example, the electric potential barrier of the intrinsic gate G* 724' against electrons rises to suppress the flow of electrons from the n+ region 702' to the n− region 706'. The signal charge under high intensity light corresponds to m electrons, which are accumulated in the n− region 706'.

The cost of designing a photoelectric conversion imaging element using fewer light receiving sections may be higher than that of a photoelectric conversion imaging element that uses many light receiving sections. However, a possible trade-off for this increased design flexibility may be greater difficulty in reducing pixel size with presently available technology. For example, because gate regions 704' can be reduced in size to allow for a larger drain region 706' in the second example embodiment of FIGS. 21-23, the ability to reduce pixel size can be more limited than in the first example embodiment of FIGS. 7-9.

Specific dopant concentration levels and dopant materials in the foregoing embodiments may vary in dependence on extrinsic region dimensions and particular layout geometries and materials, among other things. In some example implementations, intrinsic region 708 can be formed primarily or entirely of silicon. Moreover, relatively low dopant concentration p-type regions (e.g., gate regions 704 and p-type well 710) may be doped with about $10^{11}$ to $10^{15}$ boron atoms per $cm^3$, moderate dopant concentration n-type regions (e.g., drain region 706) may be doped with about $10^{16}$ to $10^{18}$ arsenic atoms per $cm^3$, and relatively high dopant concentration n-type and p-type regions (e.g., source region 702 and secondary gate and drain regions 716 and 720) may be doped with about $10^{19}$ to $10^{21}$ boron (n) or arsenic (p) atoms per $cm^3$.

In addition, although both the first and second example embodiments described above implement an n-channel (i.e., npn) phototransistor, each of the extrinsic regions may be doped as opposite polarity type semiconductor materials to implement a p-channel (i.e., pnp) phototransistor instead.

Figure 27:
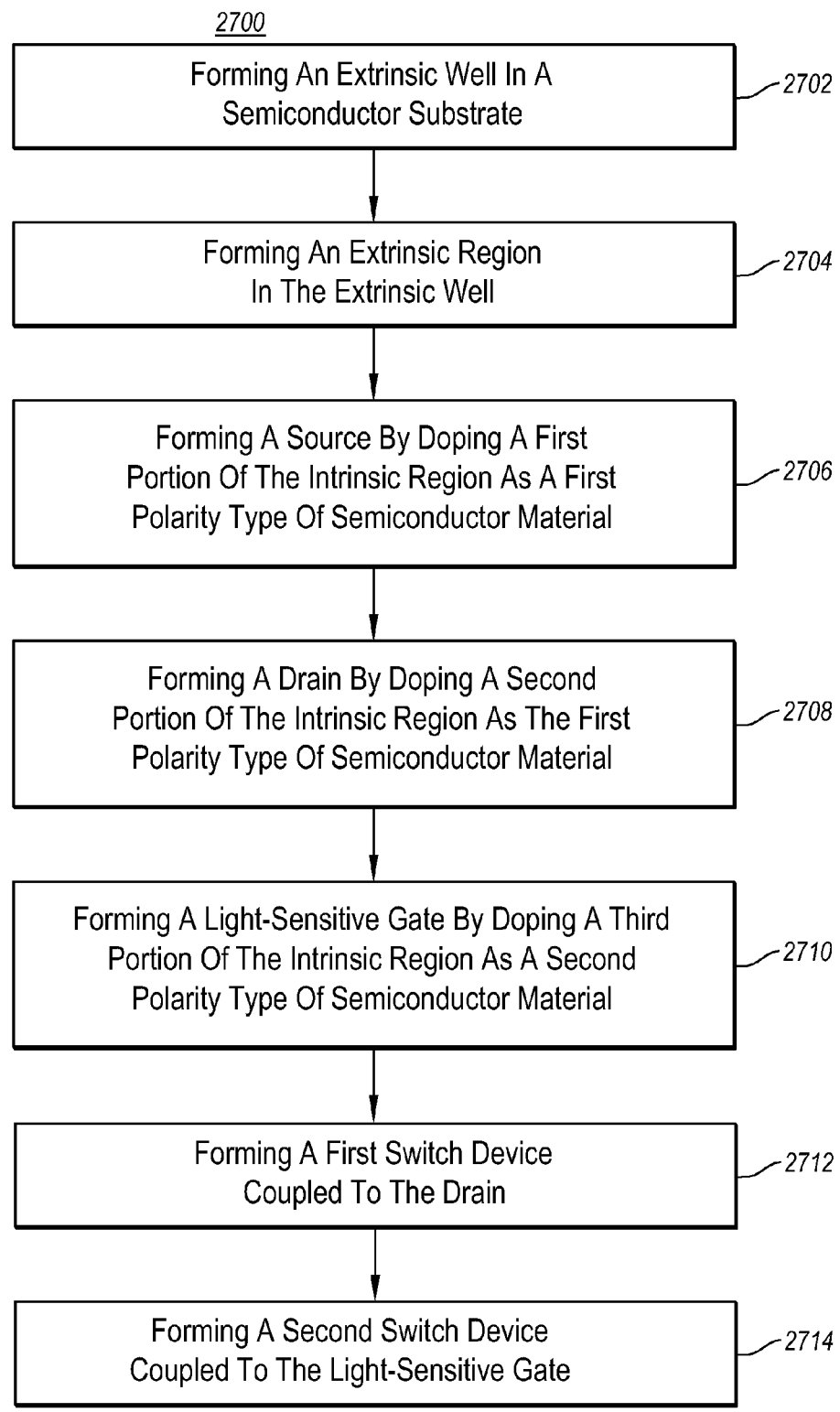
FIG. 27 depicts an example method of manufacturing a low light adaptive photoelectric imaging device in accordance with at least some examples described herein.

FIG. 27 depicts an example method of manufacturing a low light adaptive photoelectric imaging device in accordance with at least some examples described herein. A method 2700 may include one or more of the following seven blocks illustrated as blocks 2702, 2704, 2706, 2708, 2710, 2712, and/or 2714. In some examples, method 2700 may begin at block 2702.

At first block 2702, "Forming An Extrinsic Well in a Semiconductor Substrate", an extrinsic well (such as p-type well 710) can be formed in a semiconductor substrate such as n-type substrate 712. Block 2702 may be followed by block 2704. At second block 2704, "Forming an Extrinsic Region in the Extrinsic Well", an intrinsic region such as intrinsic region 708 can be formed in the extrinsic well. Block 2704 may be followed by block 2706. At third block 2706, "Forming a Source by Doping a First Portion of the Intrinsic Region as a First Polarity Type of Semiconductor Material", a source (such as source region 702) may be formed in a first portion of the intrinsic region. Block 2706 may be followed by block 2708. At block 2708, "Forming a Drain by Doping a Second Portion of the Intrinsic Region as the First Polarity Type of Semiconductor Material", a drain (such as drain region 706) may be formed in a second portion of the intrinsic region. Block 2708 may be followed by block 2710. At block 2710, "Forming a Light-Sensitive Gate by Doping a Third Portion of the Intrinsic Region as a Second Polarity Type of Semiconductor Material", a light-sensitive gate may be formed in a third portion of the intrinsic region. In one example, at least a portion of the light-sensitive gate may be located between the source and the drain. Block 2710 may be followed by block 2712. At block 2712, "Forming a First Switch Device Coupled to the Drain", a first switch device is formed to be coupled to the drain. Block 2712 may be followed by block 2714. At block 2714, "Forming a Second Switch Device Coupled to the Light-Sensitive Gate", a second switch device is formed to be coupled to the light-sensitive gate.

The source may be formed (block 2706) by doping a first portion of the intrinsic region as a first polarity type of semiconductor material; the drain may be formed (block 2708) by doping a second portion of the intrinsic region as the first polarity type of semiconductor material; and the light-sensitive gate may be formed (block 2710) by doping a third portion of the intrinsic region as a second polarity type of semiconductor material.

Furthermore, the drain and light-sensitive gate of the phototransistor may be doped to facilitate formation of a depletion capacitance between the intrinsic region and the drain that differs from a depletion capacitance between the intrinsic region and the light-sensitive gate such that an electric potential barrier is formed during operation of the imaging device. Moreover, the electric potential barrier may be formed so that a gain of the photoelectric imaging device non-linearly varies with respect to an incident light intensity.

Figure 28:
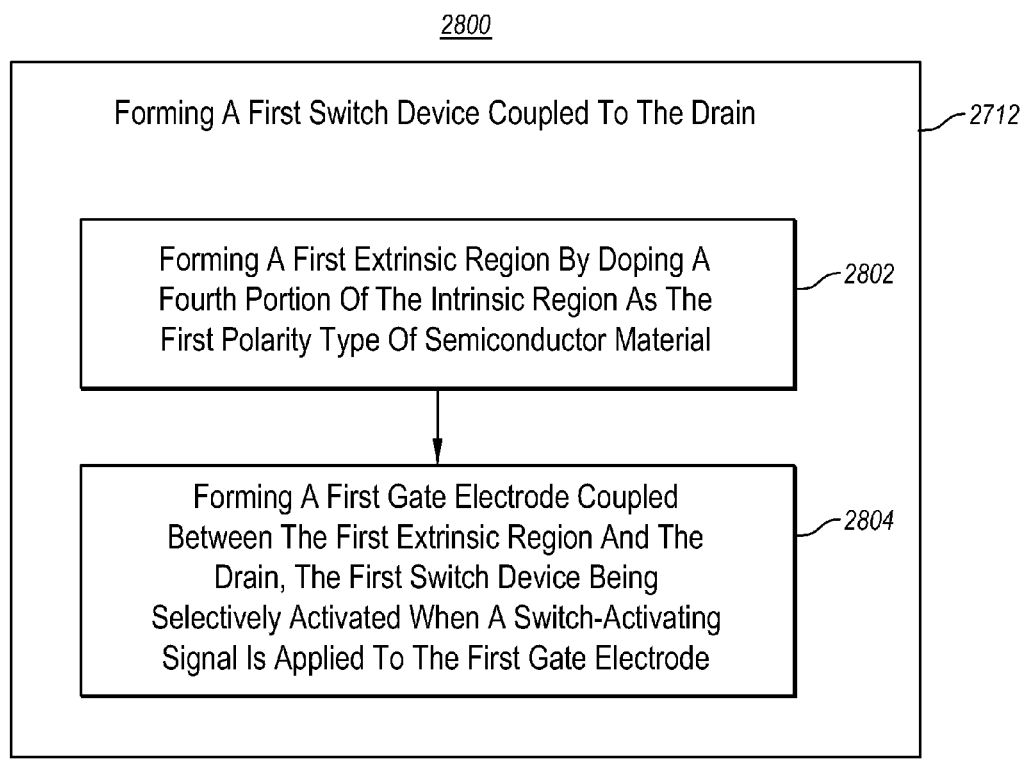
FIG. 28 depicts an example method of forming a switch device in the low light adaptive photoelectric imaging device formed by the method of FIG. 27 in accordance with at least some examples described herein.

FIG. 28 depicts an example method of forming a switch device in the low light adaptive photoelectric imaging device formed by the method of FIG. 27 in accordance with at least some examples described herein. An example method 2800 of forming the first switch device in block 2712 of FIG. 27 is depicted, which may include one or more of blocks 2802, and 2804. The method may begin at block 2802.

At block 2802, "Forming a First Extrinsic Region by Doping a Fourth Portion of the Intrinsic Region as the First Polarity Type of Semiconductor Material", a first extrinsic region can be formed by doping a fourth portion of the intrinsic region as the first polarity type of semiconductor material. Block 2802 may be followed by block 2804. At block 2804, "Forming a First Gate Electrode Coupled Between the First Extrinsic Region and the Drain, The First Switch Device Being Selectively Activated when a Switch-Activating Signal is Applied to the First Gate Electrode", a first gate electrode can be formed to couple the first extrinsic region and the drain. The first switch device may be formed so as to be capable of selective activation when a switch-activating signal is applied to the first gate electrode. The second switch device may be formed in a similar manner, except a gate electrode of the second switch device may couple a second extrinsic region with the light-sensitive gate.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, method 2700 may further include a block in which a first dark current reduction region is formed on a surface of the light-sensitive gate by doping at least a portion of a surface of the light-sensitive gate as the first polarity type of semiconductor material. In addition, a second dark current reduction region may be formed on a surface of the light-sensitive drain by doping at least a portion of a surface of the light-sensitive gate as the second polarity type of semiconductor material. Moreover, in example method 2700, the first and second polarity types of semiconductor material may be n-type and p-type, respectively or, alternatively, p-type and n-type, respectively.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods or devices, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be understood that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A low light adaptive photoelectric imager comprising:
a phototransistor including an intrinsic gate, an extrinsic gate, and a drain,
wherein the phototransistor is configured to receive incident light at least at the extrinsic gate and to convert the received incident light into an electric charge that varies responsive to an intensity of the received incident light,
wherein the extrinsic gate and the drain are extrinsically doped such that a depletion capacitance between the intrinsic gate and the drain differs from a depletion capacitance between the intrinsic gate and the extrinsic gate effective to form an electric potential barrier in the phototransistor,
the electric potential barrier effective to cause a gain of the phototransistor to non-linearly vary responsive to the intensity of the received incident light.

2. The low light adaptive photoelectric imager of claim 1, wherein the depletion capacitance between the intrinsic gate and the drain is greater than the depletion capacitance between the intrinsic gate and the extrinsic gate.

3. The low light adaptive photoelectric imager of claim 1, further comprising:
a semiconductor substrate;
an extrinsic well formed on the semiconductor substrate;
an intrinsic region formed in the extrinsic well;
a source located within the intrinsic region and doped as a first polarity type of semiconductor material;
wherein the drain is located within the intrinsic region and doped as the first polarity type of semiconductor material;
wherein the extrinsic gate includes at least a section of a light-sensitive portion, and wherein at least the section of the light-sensitive portion included in the extrinsic gate is doped as a second polarity type of semiconductor material,
wherein the light-sensitive portion also includes at least part of the intrinsic region, and extends between the source and drain;
wherein the drain and at least the section of the light-sensitive portion included in the extrinsic gate are doped to facilitate formation of a depletion region between the intrinsic region and the drain and between the intrinsic region and at least the section of the light-sensitive portion included in the extrinsic gate, and wherein a depletion capacitance in the depletion region between the intrinsic region and the drain differs from a depletion capacitance in the depletion region between the intrinsic region and at least the section of the light-sensitive portion included in the extrinsic gate such that the electric potential barrier is formed during operation of the imager.

4. The low light adaptive photoelectric imager of claim 3, wherein the drain also includes another section of the light-sensitive portion.

5. The low light adaptive photoelectric imager of claim 4, further comprising:
a first dark current reduction region formed on a surface of at least the section of the light-sensitive portion; included in the extrinsic gate, and wherein the first dark current reduction region is doped as the first polarity type of semiconductor material; and
a second dark current reduction region formed on a surface of at least the another section of the light-sensitive portion included in the drain, and wherein the second dark current reduction region is doped as the second polarity type of semiconductor material.

6. The low light adaptive photoelectric imager of claim 3, further comprising:
a first switch device coupled to the drain;
a second switch device coupled to the extrinsic gate; and
a controller configured to selectively operate the first and second switch devices to configure the photoelectric imager in either an amplification mode or an initialization mode, such that:
during the initialization mode of the photoelectric imager, the first switch device is configured to couple a first voltage to the drain, and the second switch device is configured to couple a second voltage to the extrinsic gate, and during the amplification mode of the photoelectric imager, the first switch device is configured to electrically float the drain and the second switch device is configured to electrically float the extrinsic gate.

7. The low light adaptive photoelectric imager of claim 3, wherein the first polarity type of semiconductor material includes n-type or p-type and the second polarity type of semiconductor material includes, respectively, p-type or n-type.

8. The low light adaptive photoelectric imager of claim 3, further comprising a light-mask layer that is configured to pass the incident light to at least the section of the light-sensitive portion included in the extrinsic gate.

9. A method to manufacture a low light adaptive photoelectric imager, the method comprising:
forming an extrinsic well in a semiconductor substrate;
forming an intrinsic region in the extrinsic well;
forming a source by doping a first portion of the intrinsic region as a first polarity type of semiconductor material;
forming a drain by doping a second portion of the intrinsic region as the first polarity type of semiconductor material;
forming a light-sensitive gate by doping a third portion of the intrinsic region as a second polarity type of semiconductor material, at least a portion of the light-sensitive gate being located between the source and the drain;
wherein the drain and light-sensitive gate are doped to facilitate formation of a depletion capacitance between the intrinsic region and the drain that differs from a depletion capacitance between the intrinsic region and the light-sensitive gate such that an electric potential barrier is formed during operation of the imager,
the electric potential barrier being effective to cause a gain of the photoelectric imager to non-linearly vary responsive to an incident light intensity.

10. The method of claim 9, further comprising:
forming a first dark current reduction region on a surface of the light-sensitive gate by doping at least a portion of a surface of the light-sensitive gate as the first polarity type of semiconductor material; and
forming a second dark current reduction region on a surface of the light-sensitive portion of the drain by doping at least a portion of a surface of the light-sensitive portion of the drain as the second polarity type of semiconductor material.

11. The method of claim 9, further comprising:
forming a first switch device coupled to the drain; and
forming a second switch device coupled to the light-sensitive gate,
wherein forming the first switch device includes:
forming a first extrinsic region by doping a fourth portion of the intrinsic region as the first polarity type of semiconductor material; and
forming a first gate electrode coupled between the first extrinsic region and the drain; and
wherein forming the second switch device includes:
forming a second extrinsic region by doping a fifth portion of the intrinsic region as the second polarity type of semiconductor material; and
forming a second gate electrode coupled between the second extrinsic region and the light-sensitive gate.

12. The method of claim 9, wherein the first polarity type of semiconductor material includes n-type or p-type and the second polarity type of semiconductor material includes, respectively, p-type or n-type.

13. The method of claim 9, wherein the source is more heavily doped than the drain and light-sensitive gate and the drain is more heavily doped than the light-sensitive gate.

14. The method of claim 9, further comprising:
forming a light-mask layer that is configured to pass incident light to at least a portion of the light-sensitive gate and/or to at least a portion of the drain.

15. An apparatus, comprising:
a phototransistor that includes an intrinsic gate, an extrinsic gate, a source, and a drain, and configured to receive incident light and convert the incident light into an electric charge that varies responsive to an intensity of the incident light based on a non-linear gain of the phototransistor,
wherein a depletion capacitance between the intrinsic gate of the phototransistor and the drain of the phototransistor differs from a depletion capacitance between the intrinsic gate and the extrinsic gate of the phototransistor, and wherein an electric potential barrier between the source and the drain is formed due to a difference between the depletion capacitance between the intrinsic gate and the drain and the depletion capacitance between the intrinsic gate and the extrinsic gate.

16. The apparatus of claim 15, wherein the phototransistor is configured to receive the incident light on a light-sensitive portion, wherein the light-sensitive portion at least includes sections of the intrinsic gate, the extrinsic gate, the drain, and combinations thereof.

17. The apparatus of claim 15, wherein the phototransistor further includes a light mask configured to restrict the incident light to at least a portion of the extrinsic gate.

18. The apparatus of claim 15, further comprising:
an extrinsic well formed in a semiconductor substrate; and
an intrinsic region formed in the extrinsic well;
wherein the source is formed within the intrinsic region and doped as a first polarity type of semiconductor material,
wherein the drain is formed within the intrinsic region and doped as the first polarity type of semiconductor material;
wherein the extrinsic gate is formed within the intrinsic region and doped as a second polarity type of semiconductor material, and wherein the extrinsic gate comprises two extrinsic gate areas,
wherein the intrinsic gate is formed in the intrinsic region between the source, the drain, and the two extrinsic gate areas, and
wherein the electric potential barrier is formed due to relative relations between the source, the drain, and the two extrinsic gate areas and due to their respective doping polarity types.

19. The apparatus of claim 15, further comprising:
a first dark current reduction region formed on a surface of the extrinsic gate, wherein the first dark current reduction region is configured to reduce noise generated current; and
a second dark current reduction region formed on a surface of the drain, wherein the second dark current reduction region is configured to reduce the noise generated current.

20. The apparatus of claim 15, wherein the depletion capacitance between the intrinsic gate and the drain is greater than the depletion capacitance between the intrinsic gate and the extrinsic gate such that the electric potential barrier is formed during operation of the phototransistor.

\* \* \* \* \*